US012684918B2

(12) United States Patent　　　(10) Patent No.:　US 12,684,918 B2

Eom et al.　　　　　　　　　　　　(45) Date of Patent:　　　Jul. 14, 2026

(54) DISPLAY DEVICE COMPRISING SEMICONDUCTOR LIGHT EMITTING ELEMENT

(71) Applicants:LG DISPLAY CO., LTD., Seoul (KR); LG ELECTRONICS INC., Seoul (KR)

(72) Inventors: Hyeseon Eom, Paju-si (KR); Doohyun Yoon, Paju-si (KR); Moonsun Lee, Paju-si (KR); Wonseok Choi, Seoul (KR)

(73) Assignees: LG DISPLAY CO., LTD., Seoul (KR); LG ELECTRONICS INC., Seoul (KR)

( * ) Notice: Subject to any disclaimer, the term of this patent is extended or adjusted under 35 U.S.C. 154(b) by 388 days.

(21) Appl. No.: 18/285,192

(22) PCT Filed: Mar. 31, 2022

(86) PCT No.: PCT/KR2022/004650

§ 371 (c)(1),
　　(2) Date: Sep. 29, 2023

(87) PCT Pub. No.: WO2022/211549

PCT Pub. Date: Oct. 6, 2022

(65) Prior Publication Data

US 2024/0186473 A1　　　Jun. 6, 2024

(30) Foreign Application Priority Data

Mar. 31, 2021　　(KR) ........................ 10-2021-0042252

(51) Int. Cl.
　　*H10H 20/857*　　(2025.01)
　　*H10D 86/40*　　(2025.01)
　　*H10D 86/60*　　(2025.01)
　　*H10W 90/00*　　(2026.01)

(52) U.S. Cl.
　　CPC ........ *H10H 20/857* (2025.01); *H10D 86/441* (2025.01); *H10D 86/60* (2025.01); *H10W 90/00* (2026.01)

(58) Field of Classification Search
　　CPC .... H10H 20/857; H10D 86/441; H10D 86/60; H01L 25/167; H10W 90/00
　　USPC .......................................................... 257/91
　　See application file for complete search history.

(56) References Cited

U.S. PATENT DOCUMENTS 10,468,475 B2 *　11/2019　Cai ...................... H10K 59/123
2018/0342492 A1　　11/2018　Lu
(Continued)

FOREIGN PATENT DOCUMENTS

KR　　10-2019-0075869　A　　7/2019
KR　　10-2019-0106885　A　　9/2019
(Continued)

OTHER PUBLICATIONS

International Search Report (PCT/ISA/210) issued in PCT/KR2022/004650, dated Jul. 11, 2022.

*Primary Examiner* — Tu-Tu V Ho

(74) *Attorney, Agent, or Firm* — Birch, Stewart, Kolasch & Birch, LLP

(57)　　　　　　ABSTRACT

A display device including a semiconductor light emitting device according to an embodiment includes a substrate, first assembly wiring and second assembly wiring alternately arranged on the substrate and spaced apart from each other, a planarization layer disposed on the first assembly wiring and the second assembly wiring and having a first opening, a semiconductor light emitting device disposed inside the first opening and having a first electrode overlapping the first assembled wiring and the second assembled wiring, and an assembly wiring connection pattern that electrically connects the first assembly wiring and the sec- (Continued)

ond assembly wiring. And first electrode can be electrically connected to one of the first assembly wiring and the second assembly wiring.

18 Claims, 12 Drawing Sheets

(56)                    References Cited

U.S. PATENT DOCUMENTS

| | | |
|---|---|---|
| 2019/0035980 A1 | 1/2019 | Do et al. |
| 2022/0223575 A1 | 7/2022 | Kim et al. |
| 2022/0351993 A1 | 11/2022 | Jeong et al. |
| 2022/0352244 A1 | 11/2022 | Kang et al. |
| 2022/0352448 A1 | 11/2022 | Chung et al. |
| 2022/0415992 A1 | 12/2022 | Park et al. |
| 2023/0059135 A1 | 2/2023 | Chang et al. |
| 2023/0110862 A1 | 4/2023 | Kim et al. |

FOREIGN PATENT DOCUMENTS

| | | |
|---|---|---|
| KR | 10-2019-0143840 A | 12/2019 |
| KR | 10-2020-0011964 A | 2/2020 |
| KR | 10-2020-0026681 A | 3/2020 |
| KR | 10-2020-0026845 A | 3/2020 |
| KR | 10-2020-0115868 A | 10/2020 |
| KR | 10-2020-0145965 A | 12/2020 |
| KR | 10-2021-0018591 A | 2/2021 |
| WO | WO 2017/123040 A1 | 7/2017 |

* cited by examiner

[FIG. 1]
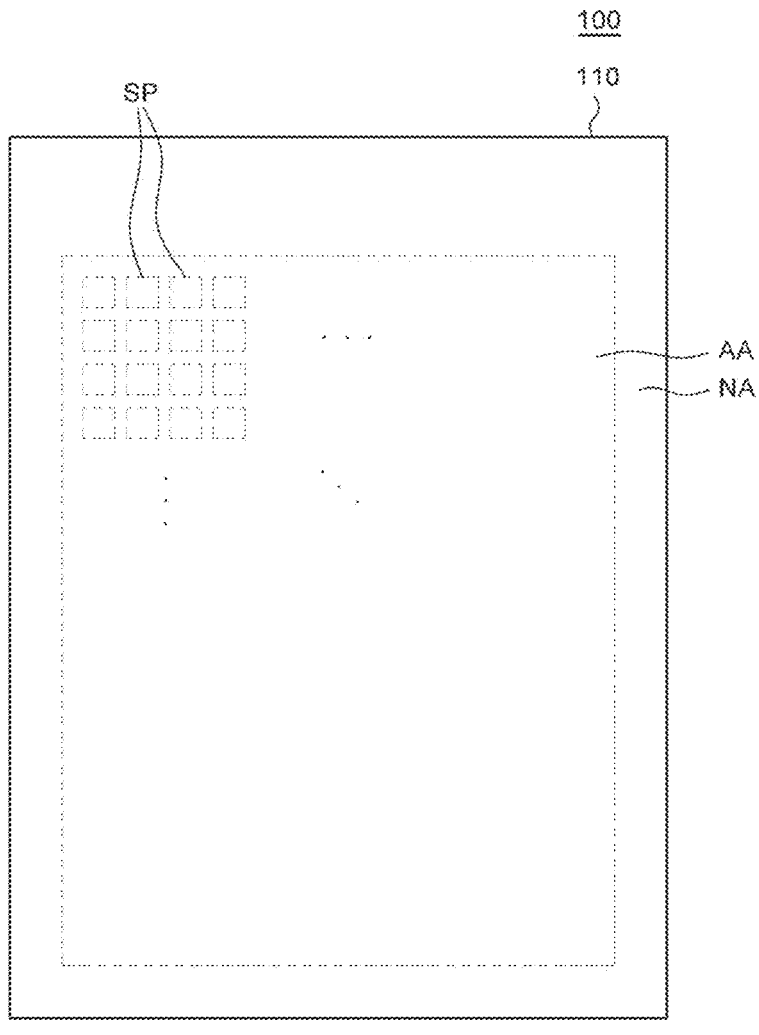

[FIG. 2]
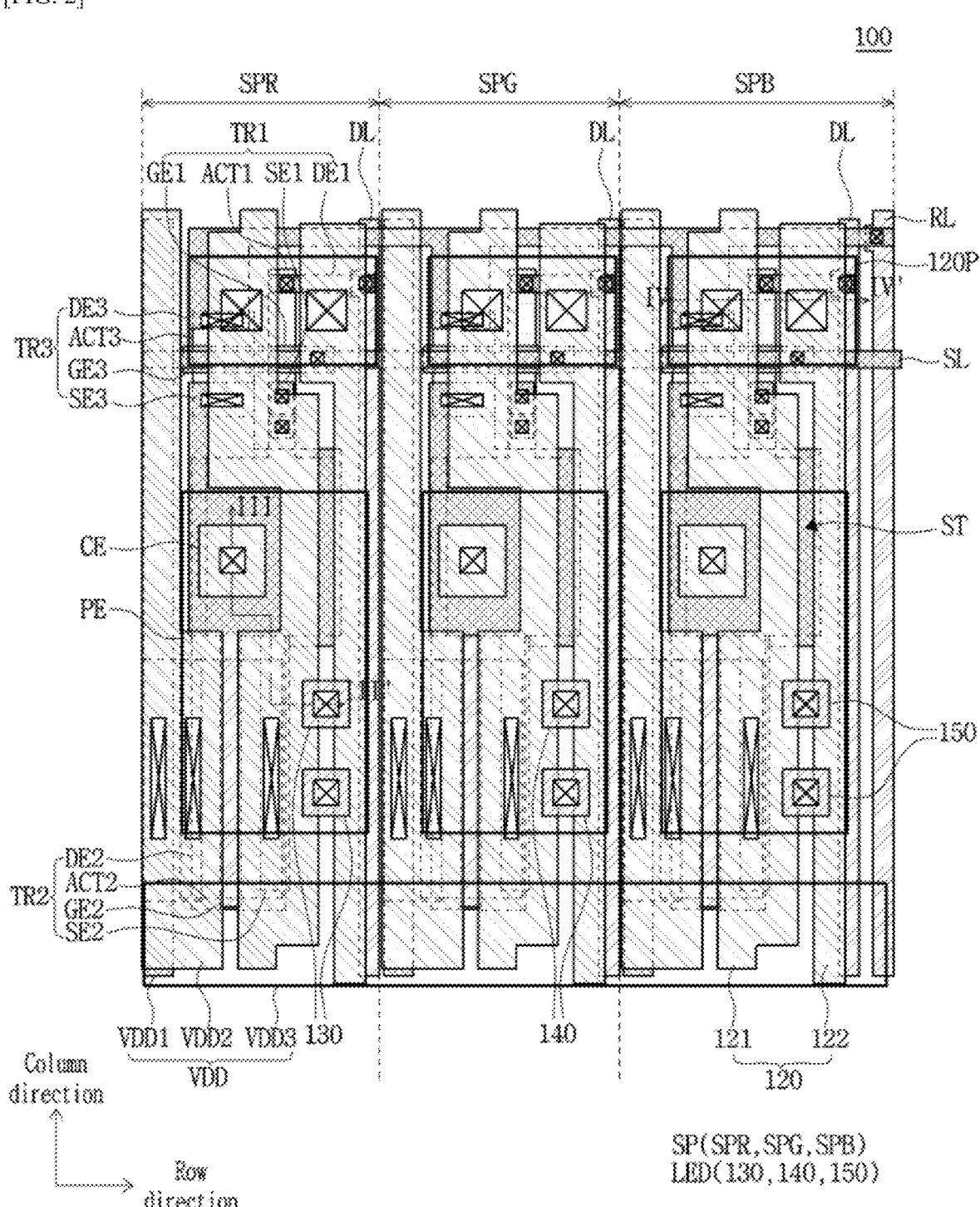

[FIG. 3]
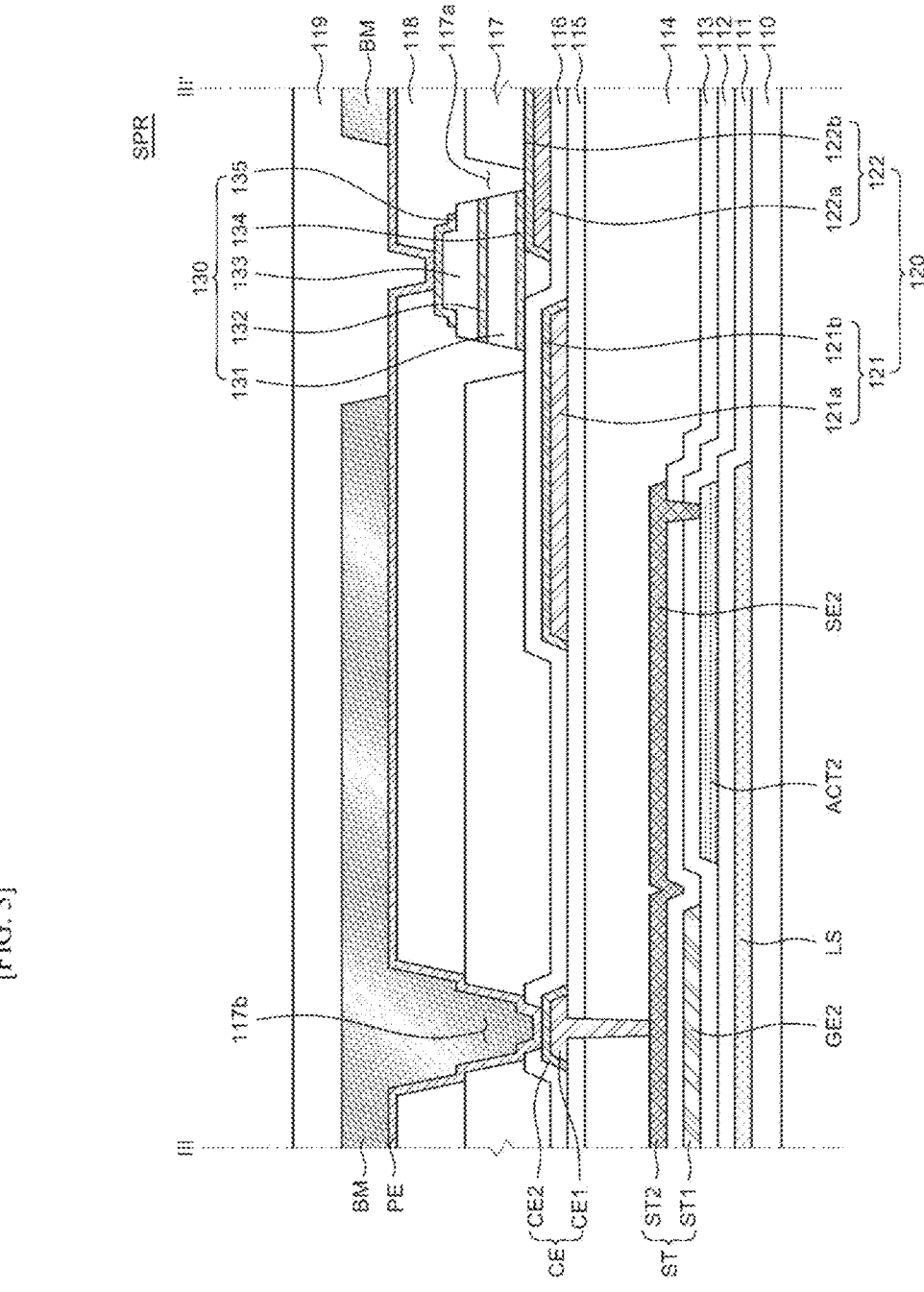

[FIG. 4]
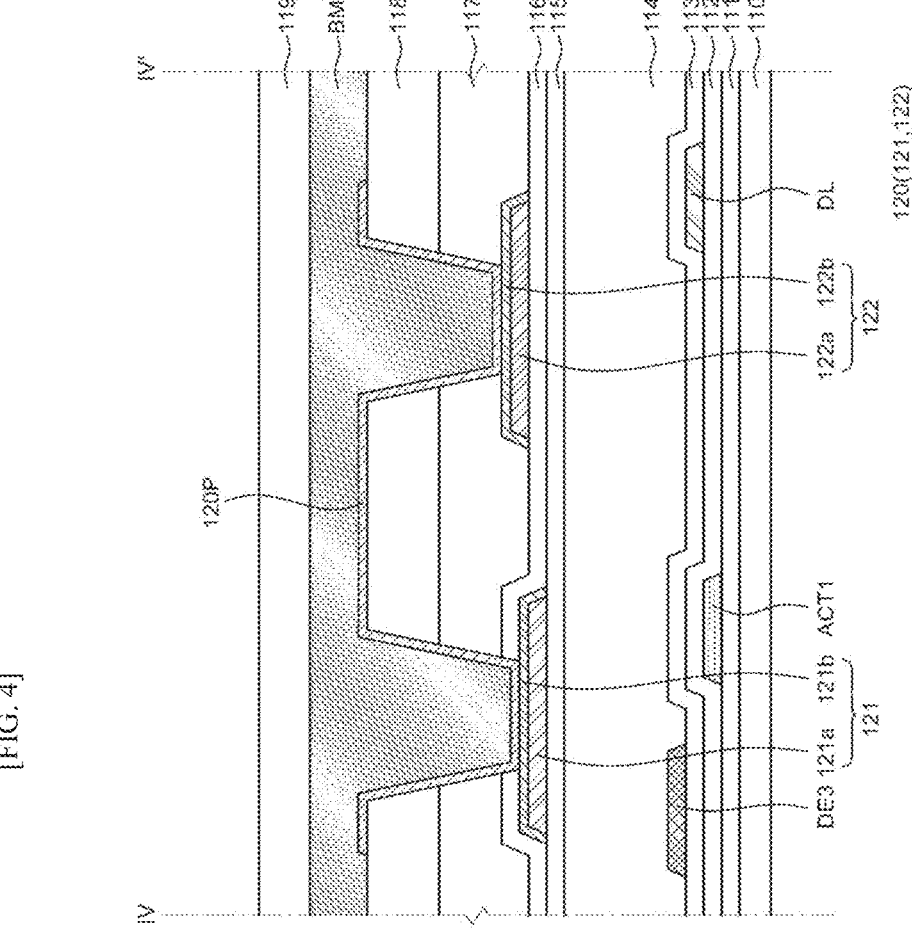

[FIG. 5A]
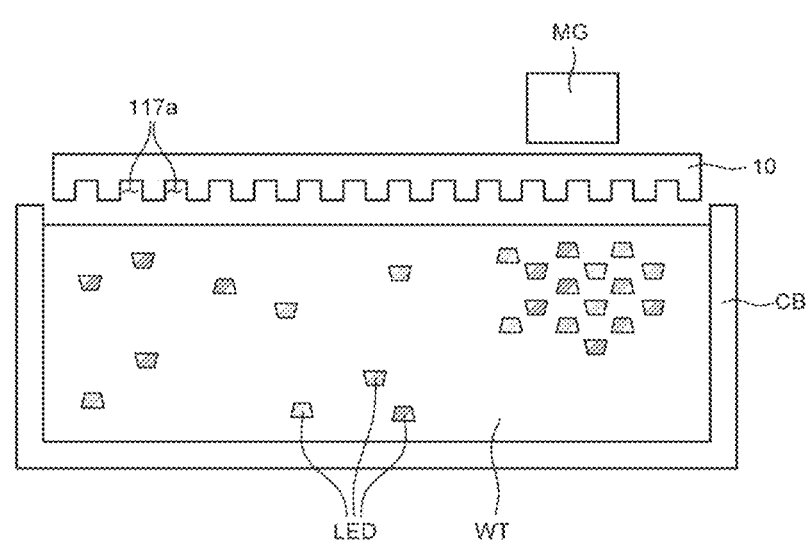

[FIG. 5B]
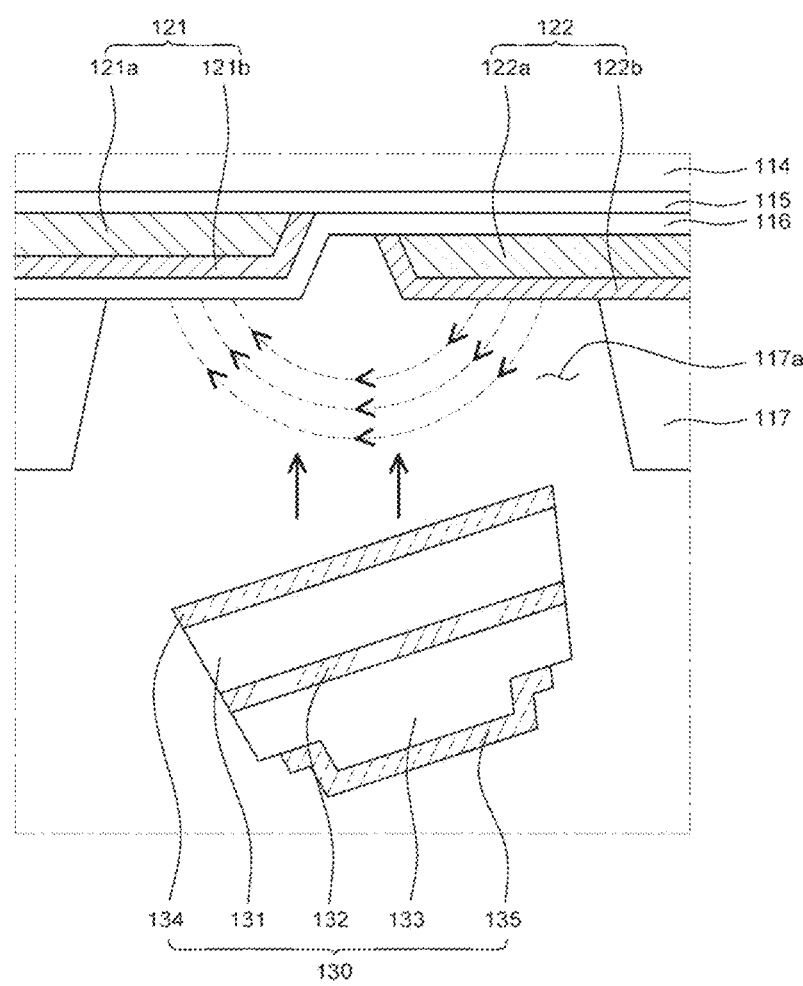

[FIG. 5C]
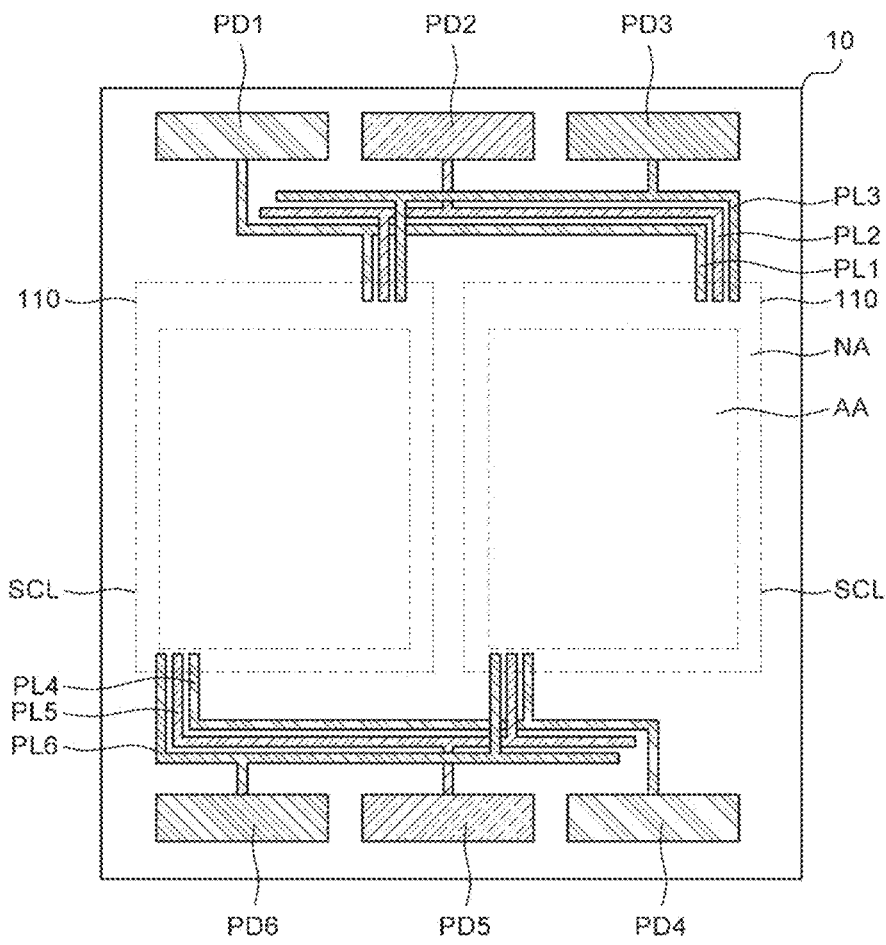
PD(PD1,PD2,PD3,PD4,PD5,PD6)
PL(PL1,PL2,PL3,PL4,PL5,PL6)

[FIG. 5D]
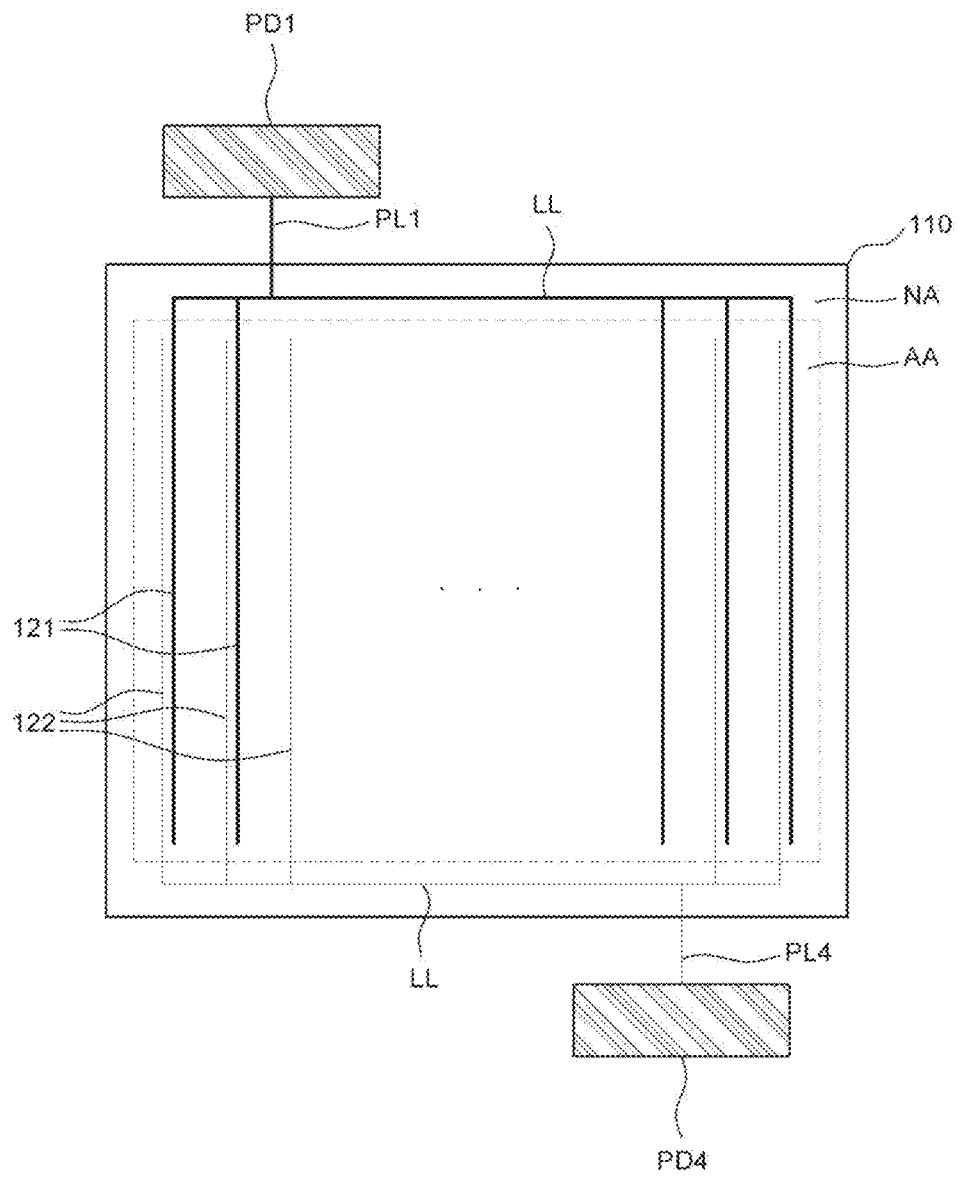

[FIG. 5E]
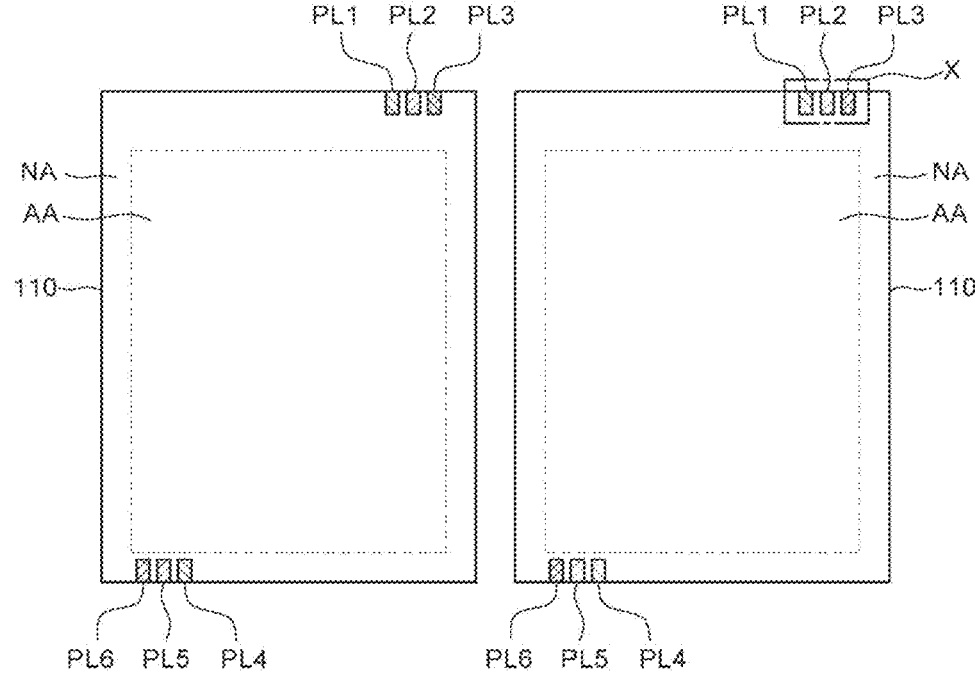
[FIG. 5F]
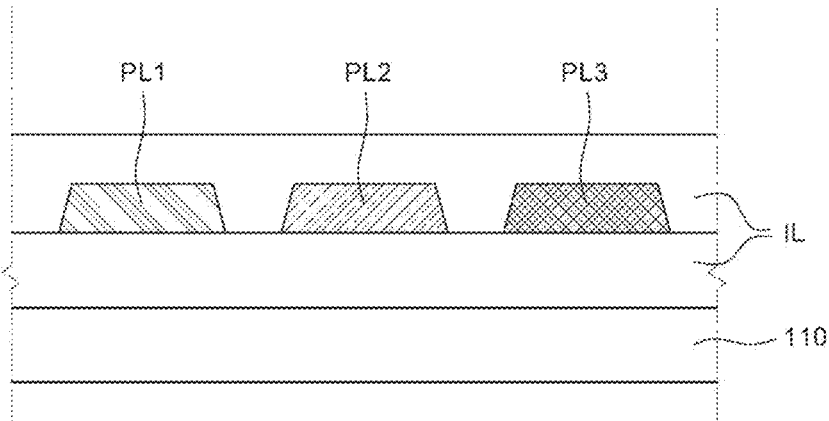

[FIG. 6]
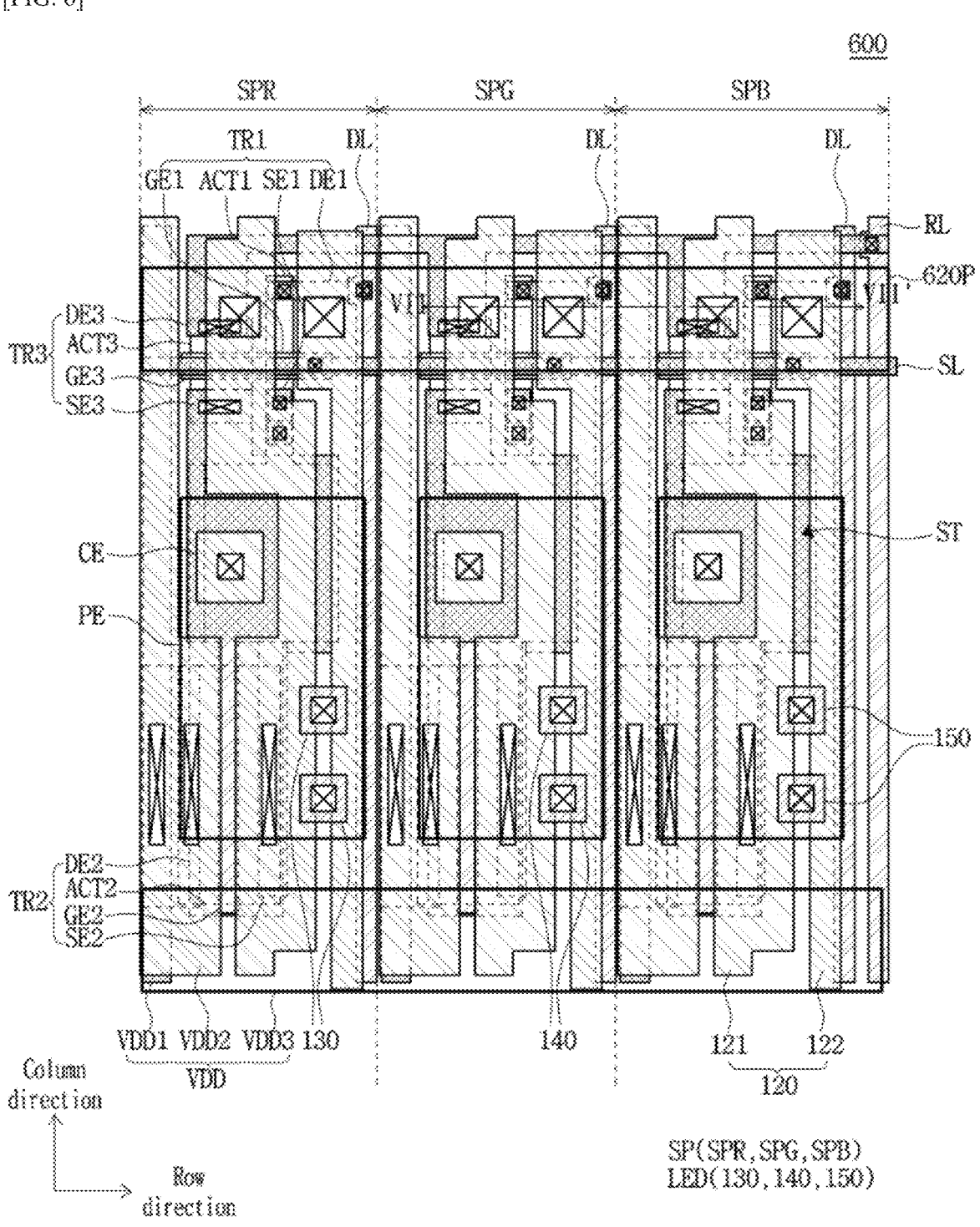

[FIG. 7]
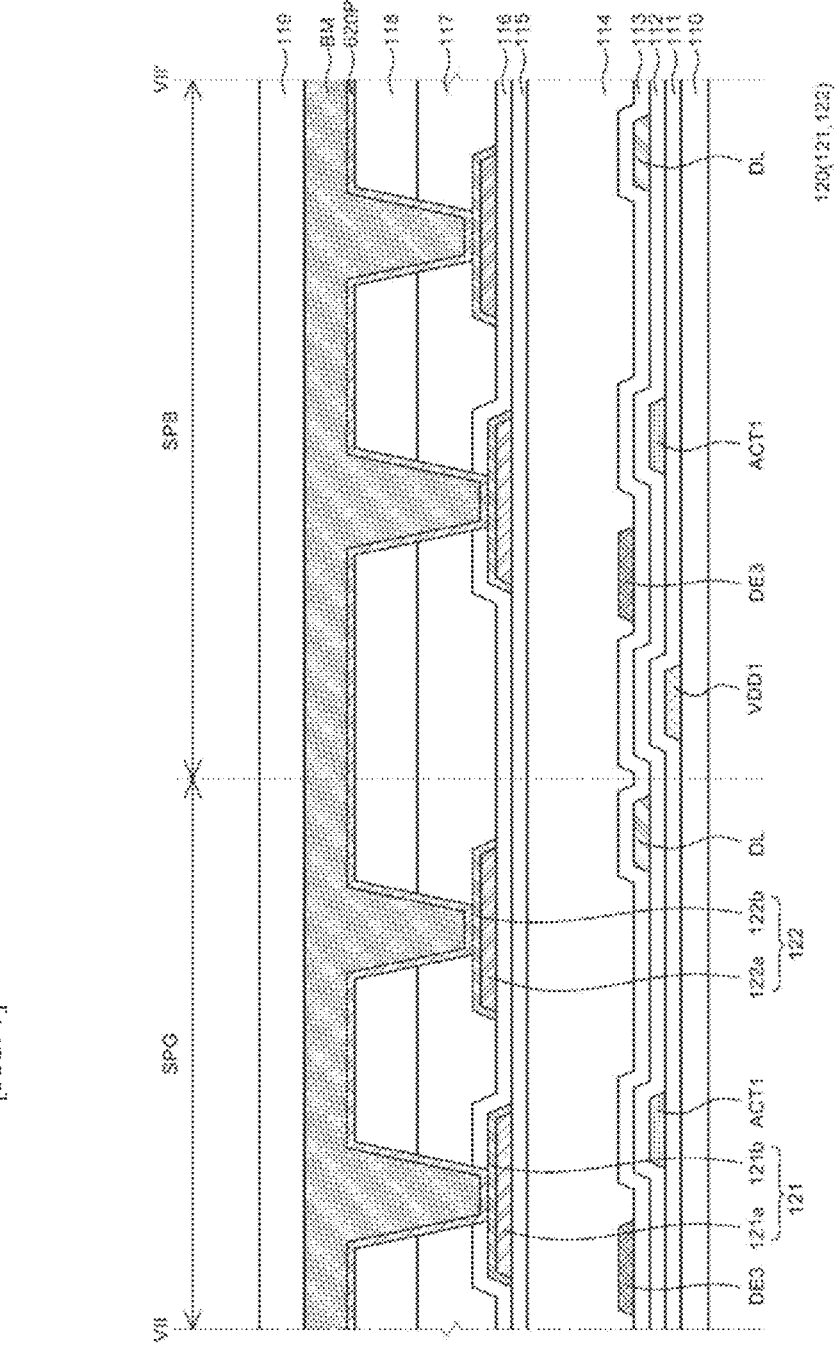

[FIG. 8]
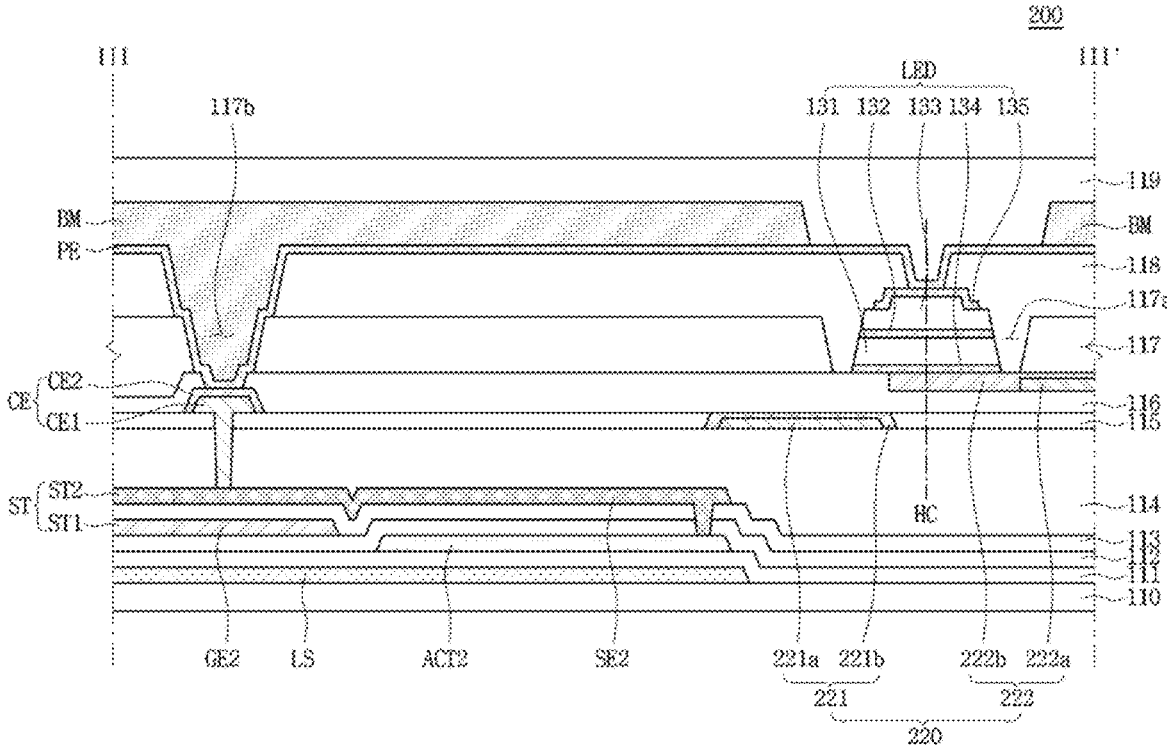
[FIG. 9]
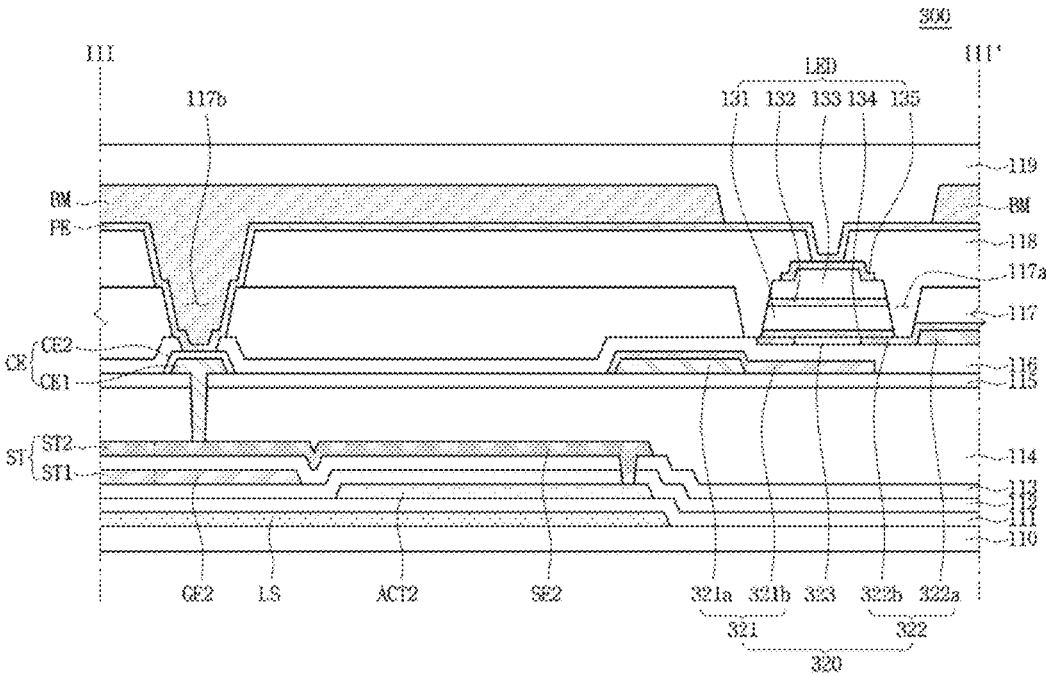

DISPLAY DEVICE COMPRISING SEMICONDUCTOR LIGHT EMITTING ELEMENT

CROSS REFERENCE TO RELATED APPLICATIONS

This application is the National Phase of PCT International Application No. PCT/KR2022/004650, filed on Mar. 31, 2022, which claims priority under 35 U.S.C. 119(a) to Patent Application No. 10-2021-0042252, filed in the Republic of Korea on Mar. 31, 2021, all of which are hereby expressly incorporated by reference into the present application.

TECHNICAL FIELD

The embodiment relates to a display device, and more specifically, to a display device including a semiconductor light emitting device.

BACKGROUND ART

Display devices used in computer monitors, TVs, mobile phones, etc. include Organic Light Emitting Displays that emit light on their own, Liquid Crystal Displays (LCDs) that require a separate light source or and micro-LED displays.

A micro-LED display is a display that uses micro-LED, a semiconductor light emitting device with a diameter or cross-sectional area of 100 μm or less, as a display device.

Because micro-LED displays use micro-LED, a semiconductor light-emitting device, as a display device, micro-LED displays have excellent performance in many characteristics such as contrast ratio, response speed, color gamut, viewing angle, brightness, resolution, lifespan, luminous efficiency, and luminance.

In particular, the micro-LED display has the advantage of being able to freely adjust the size and resolution and implement a flexible display because the screen can be separated and combined in a modular manner.

However, because large micro-LED displays require more than millions of micro-LEDs, there is a technical problem that makes it difficult to quickly and accurately transfer micro-LEDs to the display panel. Meanwhile, methods for transferring a semiconductor light emitting device to a substrate include a pick and place process, a laser lift-off method, or a self-assembly method.

Among these, the self-assembly method is a method in which the semiconductor light-emitting device finds its assembly position within the fluid on its own, and is an advantageous method for implementing a large-screen display device.

Meanwhile, when a light emitting device is transferred in a fluid, there is a problem that the assembly wiring is corroded by the fluid. Corrosion of the assembly wiring can cause an electrical short circuit and cause assembly defects.

Additionally, if a plurality of assembled wires electrically connected to the light emitting device have different potentials, resistance can increase, resulting in difficulties in transmitting electrical signals.

DISCLOSURE

Technical Problem

The technical object of the embodiment is to provide a display device that improves the assembly rate of light-emitting devices by implementing assembly wiring in various forms.

Additionally, the technical object of the embodiment is to provide a display device with improved resistance of assembly wiring.

In addition, the technical object of the embodiment is to provide a display device that utilizes the assembly wiring for self-assembly of the light-emitting device as the wiring for driving the light-emitting device.

Additionally, the technical object of the embodiment is to provide a display device that minimizes corrosion of assembly wiring.

Additionally, the technical object of the embodiment is to provide a display device with enhanced assembly force for light emitting devices.

Additionally, the technical object of the embodiment is to provide a display device that reduces bias of light emitting devices.

The technical object of the embodiment are not limited to the objects mentioned above and include what can be understood from the specification.

Technical Solution

A display device including a semiconductor light emitting device according to an embodiment includes a substrate, first assembly wiring and second assembly wiring alternately arranged on the substrate and spaced apart from each other, a planarization layer disposed on the first assembly wiring and the second assembly wiring and having a first opening: and a semiconductor light emitting device disposed inside the first opening, wherein a first electrode thereof overlaps the first assembly wiring and the second assembly wiring;

an assembly wiring connection pattern that is spaced apart from the first opening and electrically connects the first assembly wiring and the second assembly wiring.

The first electrode can be electrically connected to one of the first assembly wiring and the second assembly wiring.

In the embodiment, the first assembly wiring and the second assembly wiring extend in a column direction, The assembly wiring connection pattern can extend in the row direction to electrically connect adjacent first assembly wirings and second assembly wirings among the first assembly wiring and the plurality of second assembly wirings.

Within the first opening, the first assembly wiring can be separated from the first electrode, and the second assembly wiring can be in contact with the first electrode.

The first assembly wiring can be electrically connected to the first electrode through the assembly wiring connection pattern and the second assembly wiring.

The embodiment can further include an insulating layer covering the first assembly wiring.

The assembly wiring connection pattern can be in contact with the first assembly wiring through a contact hole in the planarization layer and the insulating layer, and can be in contact with the second assembly wiring through a contact hole in the planarization layer.

The embodiment can further include a pixel electrode disposed on the semiconductor light emitting device and the planarization layer.

The pixel electrode can be disposed on the same plane as the assembly wiring connection pattern. The first assembly wiring, the second assembly wiring, and the assembly wiring connection pattern can have the same potential.

The second assembly wiring can be arranged to extend beyond a center of the assembly hole, and can be arranged on a different plane from the first assembly wiring.

The first assembly wiring vertically overlaps the second assembly wiring,

The second assembly wiring can include an electrode hole in a region that vertically overlaps the first assembly wiring.

In addition, a display device including a semiconductor light emitting device according to an embodiment includes a substrate having a plurality of sub-pixels defined, a first assembly wiring arranged along a plurality of sub-pixels arranged in a same column among the plurality of sub-pixels, a second assembly wiring arranged along the plurality of sub-pixels arranged in the same column among the plurality of sub-pixels, the second assembly wiring being disposed adjacent to each of the first assembly wirings, a planarization layer including a first opening overlapping the first assembly wiring and the second assembly wiring: a semiconductor light emitting device disposed in the first opening of each of the plurality of sub-pixels and electrically connected to the second assembly wiring: and an assembly wiring connection pattern disposed on the planarization layer and electrically connected to the first assembly wiring and the second assembly wiring.

The first assembly wiring can be electrically connected to the semiconductor light emitting device through the assembly wiring connection pattern and the second assembly wiring, In the first opening, the plurality of first assembly wirings can be spaced apart from the semiconductor light emitting device.

The assembly wiring connection pattern can electrically connect the first assembly wiring and the second assembly wiring disposed in one sub-pixel of the first assembly wiring and the second assembly wiring.

The assembly wiring connection pattern can be disposed along a plurality of sub-pixels arranged in the same row among the plurality of sub-pixels to electrically connect the first assembly wiring and the second assembly wiring.

The first assembly wiring, the second assembly wiring, and the assembly wiring connection pattern can form a mesh shape.

The second assembly wiring can be arranged to extend beyond a center of the assembly hole.

The second assembly wiring can be arranged on a different plane from the first assembly wiring.

The first assembly wiring can vertically overlap the second assembly wiring.

The second assembly wiring can include an electrode hole in a region that vertically overlaps the first assembly wiring.

Advantageous Effects

According to the embodiment, there is a technical effect in that wiring for self-assembly of a light-emitting device can also be used as a wiring for driving the light-emitting device.

Additionally, the embodiment has the technical effect of minimizing defects that occur during self-assembly or bonding of light-emitting devices by improving the structure of a plurality of assembly wires.

Additionally, the embodiment has the technical effect of minimizing corrosion and short circuit defects in a plurality of assembly wiring.

For example, corrosion of the conductive layer can be prevented by using a corrosion-resistant clad layer.

Additionally, the embodiment has the technical effect of improving the resistance of a plurality of assembly wiring.

For example, by connecting a plurality of assembled wires using an assembled wire connection pattern, each assembled wire can obtain the same potential and improve resistance.

Additionally, the embodiment has the technical effect of strengthening the assembly force of the light emitting device by arranging a plurality of assembly wirings in a vertically symmetrical structure.

In addition, the embodiment can solve the problem of tilting of the light emitting device by supporting the light emitting device with one assembly wiring.

Effects according to the embodiment are not limited to the content exemplified above, and more diverse effects are included in the embodiment.

DESCRIPTION OF DRAWINGS

FIG. 1 is a schematic plan view of a display device according to an embodiment.

FIG. 2 is a schematic enlarged plan view of a display device according to an embodiment.

FIG. 3 is a cross-sectional view taken along line III-III' of FIG. 2.

FIG. 4 is a cross-sectional view taken along line IV-IV of FIG. 2.

FIGS. 5A to 5F are process diagrams for explaining a manufacturing method of a display device according to an embodiment.

FIG. 6 is a plan view of a display device according to a second embodiment.

FIG. 7 is a cross-sectional view taken along line VII-VII' of FIG. 6.

FIG. 8 is a cross-sectional view of a display device according to a third embodiment.

FIG. 9 is a cross-sectional view of a display device according to a fourth embodiment.

MODE FOR INVENTION

Hereinafter, embodiments disclosed in this specification will be described in detail with reference to the attached drawings. The suffixes 'module' and 'part' for components used in the following description are given or used interchangeably in consideration of ease of specification preparation, and do not have distinct meanings or roles in themselves. Additionally, the attached drawings are intended to facilitate easy understanding of the embodiments disclosed in this specification, and the technical idea disclosed in this specification is not limited by the attached drawings. Additionally, when an element such as a layer, region or substrate is referred to as being 'on' another component, this includes either directly on the other element or there can be other intermediate elements in between.

Display devices described in this specification include digital TVs, mobile phones, smart phones, laptop computers, digital broadcasting terminals, personal digital assistants (PDAs), portable multimedia players (PMPs), navigation, and slates PCs, tablet PCs, ultra-books, desktop computers, etc. However, the features according to the embodiment described in this specification can be applied to a device capable of displaying even if it is a new product type that is developed in the future.

Hereinafter, embodiments will be described with reference to the drawings.

FIG. 1 is a schematic plan view of a display device according to an embodiment. For convenience of explanation, only the substrate 110 and the plurality of sub-pixels (SP) among the various components of the display device 100 are shown in FIG. 1.

The display device 100 according to an embodiment can include a flexible display manufactured on a thin and flexible substrate. Flexible displays can bend or curl like paper while maintaining the characteristics of existing flat displays.

In a flexible display, visual information can be implemented by independently controlling the light emission of unit pixels arranged in a matrix form. A unit pixel refers to the minimum unit for implementing one color. A unit pixel of a flexible display can be implemented by a light emitting device. In the embodiment, the light emitting device can be Micro-LED or Nano-LED, but is not limited thereto.

The substrate 110 is configured to support various components included in the display device 100 and can be made of an insulating material. For example, the substrate 110 can be made of glass or resin. Additionally, the substrate 110 can include polymer or plastic, or can be made of a material with flexibility.

The substrate 110 includes a display area (AA) and a non-display area (NA).

The display area AA is an area where a plurality of sub-pixels SP are arranged and an image is displayed. Each of the plurality of sub-pixels (SP) is an individual unit that emits light, and a semiconductor light-emitting device (LED) and a driving circuit are formed in each of the plurality of sub-pixels (SP). For example, the plurality of sub-pixels SP can include, but are not limited to, a red sub-pixel, a green sub-pixel, a blue sub-pixel, and/or a white sub-pixel. Hereinafter, the description will be made on the assumption that the plurality of sub-pixels SP includes a red sub-pixel, a green sub-pixel, and a blue sub-pixel, but is not limited thereto.

The non-display area (NA) is an area where images are not displayed, and is an area where various wiring, driver ICs, etc. for driving the sub-pixels (SP) arranged in the display area (AA) are placed. For example, various ICs such as gate driver ICs and data driver ICs and driving circuits can be placed in the non-display area (NA). Meanwhile, the non-display area NA can be located on the back of the substrate 110, that is, on the side without the sub-pixel SP, or can be omitted, and is not limited to what is shown in the drawing.

The display device 100 of the embodiment can drive the light emitting device including an active matrix (AM) method or a passive matrix (PM) method.

Hereinafter, FIGS. 2 and 3 will be referred to together for a more detailed description of the plurality of sub-pixels (SP).

FIG. 2 is a schematic enlarged plan view of a display device according to an embodiment. FIG. 3 is a cross-sectional view taken along line III-III' of FIG. 2.

FIG. 4 is a cross-sectional view taken along line IV-IV' of FIG. 2. Referring to FIGS. 2 to 4, the display device 100 according to the embodiment includes a plurality of scan wires (SL), a plurality of data wires (DL), a plurality of high potential power wires (VDD), and a plurality of assembly wires. (120), a first transistor (TR1), a second transistor (TR2), a third transistor (TR3), and a storage capacitor (ST) of each of the plurality of reference lines (RL) and the black matrix (BM) and the plurality of sub-pixels (SP), semiconductor light emitting device (LED), light blocking layer (LS), buffer layer 111, gate insulating layer 112, a plurality of passivation layers (113, 115, 116), a plurality of planarization layers (114, 117, 118), a connection electrode (CE), a pixel electrode (PE), and an assembly wiring connection pattern (120P).

Referring to FIGS. 2 and 3, a plurality of data wires DL, a first layer (VDD1) and a second layer (VDD2) of the high-potential power wire (VDD), a plurality of reference wires (RL), and a plurality of assembly wiring 120 can extend in the column direction between the plurality of sub-pixels SP. The third layer VDD3 of the plurality of scan lines SL and the high potential power line VDD can extend in the row direction between the plurality of sub-pixels SP. Additionally, a first transistor TR1, a second transistor TR2, a third transistor TR3, and a storage capacitor ST can be disposed in each of the plurality of sub-pixels SP.

First, the first layer (VDD1) and the light blocking layer (LS) of the high-potential power line (VDD) can be disposed on the substrate 110.

The high-potential power supply line (VDD) is a line that transmits a high-potential power supply voltage to each of the plurality of sub-pixels (SP). A plurality of high-potential power supply lines (VDD) can transmit a high-potential power supply voltage to the second transistor TR2 of each of the plurality of sub-pixels (SP).

Meanwhile, the plurality of high-potential power supply wires (VDD) can be made of a single layer or multiple layers. For convenience of explanation, hereinafter, the description will be made on the assumption that the plurality of high-potential power supply wires (VDD) are made of a plurality of layers.

The high-potential power wiring (VDD) includes a plurality of first layers (VDD1), a plurality of second layers (VDD2), and a plurality of third layers (VDD3) connecting them. The first layer VDD1 can extend in the column direction between each of the plurality of sub-pixels SP.

The light blocking layer LS can be disposed in each of the plurality of sub-pixels SP on the substrate 110. The light blocking layer LS blocks light incident from the lower part of the substrate 110 to the second active layer ACT2 of the second transistor TR2, which will be described later, and can minimize leakage current.

The buffer layer 111 is disposed on the first layer (VDD1) and the light blocking layer (LS) of the high-potential power supply line (VDD). The buffer layer 111 can reduce penetration of moisture or impurities through the substrate 110. The buffer layer 111 can be composed of, for example, a single layer or a multiple layer of silicon oxide (SiOx) or silicon nitride (SiNx), but is not limited thereto. However, the buffer layer 111 can be omitted depending on the type of substrate 110 or the type of transistor, but is not limited thereto.

A plurality of scan wires (SL), a plurality of reference wires (RL), a plurality of data wires (DL), a first transistor (TR1), a second transistor (TR2), a third transistor (TR3), and a storage capacitor (ST) can be disposed on the buffer layer 111.

First, the first transistor TR1 can be disposed in each of the plurality of sub-pixels SP. The first transistor TR1 includes a first active layer ACT1, a first gate electrode GE1, a first source electrode SE1, and a first drain electrode DE1. The first active layer (ACT1) is disposed on the buffer layer (111). The first active layer ACT1 can be made of a semiconductor material such as oxide semiconductor, amorphous silicon, or polysilicon, but is not limited thereto.

The gate insulating layer 112 is disposed on the first active layer ACT1. The gate insulating layer 112 is an insulating layer for insulating the first active layer (ACT1) and the first gate electrode (GE1), and can be composed of a single layer or multiple layers of silicon oxide (SiOx) or silicon nitride (SiNx). However, it is not limited to this.

The first gate electrode GE1 can be disposed on the gate insulating layer 112. The first gate electrode GE1 can be electrically connected to the scan line SL. The first gate electrode GE1 is made of a conductive material, such as copper (Cu), aluminum (Al), molybdenum (Mo), nickel (Ni), titanium (Ti), chromium (Cr), or an alloy thereof, but is not limited to this.

The first passivation layer 113 can be disposed on the first gate electrode GE1. Contact holes can be formed in the first passivation layer 113 to connect the first source electrode SE1 and the first drain electrode DE1 to the first active layer ACT1. The first passivation layer 113 is an insulating layer to protect the structure below the first passivation layer 113, and can be composed of a single layer or multiple layers of silicon oxide (SiOx) or silicon nitride (SiNx), but is not limited thereto.

A first source electrode (SE1) and a first drain electrode (DE1) electrically connected to the first active layer (ACT1) can be disposed on the first passivation layer (113). The first drain electrode DE1 can be connected to the data line DL, and the first source electrode SE1 can be connected to the second gate electrode GE2 of the second transistor TR2. The first source electrode (SE1) and the first drain electrode (DE1) are made of a conductive material, such as copper (Cu), aluminum (Al), molybdenum (Mo), nickel (Ni), titanium (Ti), chromium (Cr) or an alloy thereof, but is not limited thereto.

Meanwhile, in the embodiment, each of the first source electrode (SE1) and the first drain electrode (DE1) is described as being connected to the second gate electrode (GE2) and the data line (DL), but depending on the type of transistor, the first source electrode SE1 can be connected to the data line DL, and the first drain electrode DE1 can be connected to the second gate electrode GE2 of the second transistor TR2, but are not limited thereto.

The first gate electrode GE1 of the first transistor TR1 is connected to the scan line SL and can be turned on or off depending on the scan signal. The first transistor TR1 can transfer a data voltage to the second gate electrode GE2 of the second transistor TR2 based on the scan signal, and can be referred to as a switching transistor.

Meanwhile, a plurality of data lines DL and a plurality of reference lines RL can be disposed on the gate insulating layer 112 along with the first gate electrode GE1. The plurality of data lines DL and the reference lines RL can be formed of the same material and process as the first gate electrode GE1.

The plurality of data lines DL are lines that transmit data voltages to each of the plurality of sub-pixels SP. The plurality of data lines DL can transmit data voltage to the first transistor TR1 of each of the plurality of sub-pixels SP. For example, the plurality of data lines (DL) include a data line (DL) that transmits the data voltage to the red sub-pixel (SPR), a data line (DL) that transmits the data voltage to the green sub-pixel (SPG), and a blue sub-pixel (DL) that transmits the data voltage to the red sub-pixel (SPR). It can be composed of a data line (DL) that transmits a data voltage to the pixel (SPB).

The plurality of reference wires RL are wires that transmit a reference voltage to each of the plurality of sub-pixels SP. The plurality of reference lines RL can transmit a reference voltage to the third transistor TR3 of each of the plurality of sub-pixels SP.

A second transistor TR2 can be disposed in each of the plurality of sub-pixels SP. The second transistor TR2 can include a second active layer ACT2, a second gate electrode GE2, a second source electrode SE2, and a second drain electrode DE2. The second active layer (ACT2) can be disposed on the buffer layer 111. The second active layer ACT2 can be made of a semiconductor material such as oxide semiconductor, amorphous silicon, or polysilicon, but is not limited thereto.

The gate insulating layer 112 can be disposed on the second active layer ACT2, and the second gate electrode GE2 can be disposed on the gate insulating layer 112. The second gate electrode GE2 can be electrically connected to the first source electrode SE1 of the first transistor TR1. The second gate electrode GE2 is made of a conductive material, such as copper (Cu), aluminum (Al), molybdenum (Mo), nickel (Ni), titanium (Ti), chromium (Cr), or an alloy thereof, but is not limited to this.

The first passivation layer 113 can be disposed on the second gate electrode GE2, and the second source electrode SE2 and the second drain electrode DE2 can be disposed on the first passivation layer 113. The second source electrode SE2 can be electrically connected to the second active layer ACT2. The second drain electrode DE2 can be electrically connected to the second active layer ACT2 and at the same time can be electrically connected to the high potential power supply line VDD. The second drain electrode DE2 can be disposed between the first layer VDD1 and the second layer VDD2 of the high potential power line VDD and electrically connected to the high potential power line VDD.

The second transistor TR2 has a second gate electrode GE2 connected to the first source electrode SE1 of the first transistor TR1, and is turned on by the data voltage transmitted when the first transistor TR1 is turned on. And the turned-on second transistor TR2 can transfer a driving current to the light emitting device (LED) based on the high-potential power supply voltage from the high-potential power supply line (VDD), and thus can be referred to as a driving transistor.

A third transistor TR3 is disposed in each of the plurality of sub-pixels SP. The third transistor TR3 includes a third active layer ACT3, a third gate electrode GE3, a third source electrode SE3, and a third drain electrode DE3. The third active layer (ACT3) can be disposed on the buffer layer 111. The third active layer (ACT3) can be made of a semiconductor material such as oxide semiconductor, amorphous silicon, or polysilicon, but is not limited thereto.

The gate insulating layer 112 can be disposed on the third active layer ACT3, and the third gate electrode GE3 can be disposed on the gate insulating layer 112. The third gate electrode GE3 is connected to the scan line SL, and the third transistor TR3 can be turned on or off by the scan signal. The third gate electrode GE3 is made of a conductive material, such as copper (Cu), aluminum (Al), molybdenum (Mo), nickel (Ni), titanium (Ti), chromium (Cr), or an alloy thereof, but is not limited to this.

However, although it is explained that the third gate electrode (GE3) and the first gate electrode (GE1) are connected to the same scan line (SL), the third gate electrode (GE3) is a different scan line from the first gate electrode (GE1). It can be connected to (SL), but is not limited to this.

The first passivation layer 113 can be disposed on the third gate electrode GE3, and the third source electrode SE3 and the third drain electrode DE3 can be disposed on the first passivation layer 113. The third source electrode (SE3) is formed integrally with the second source electrode (SE2), is electrically connected to the third active layer (ACT3), and is electrically connected to the second source electrode (SE2) of the second transistor (TR2). And the third drain electrode DE3 can be electrically connected to the reference wiring RL.

The third transistor TR3 can be electrically connected to the second source electrode (SE2), the reference line (RL), and the storage capacitor (ST) of the second transistor (TR2), which is a driving transistor. It can be referred to as a sensing transistor.

A storage capacitor (ST) can be disposed in each of the plurality of sub-pixels (SP). The storage capacitor ST includes a first capacitor electrode ST1 and a second capacitor electrode ST2. The storage capacitor ST is connected between the second gate electrode GE2 and the second source electrode SE2 of the second transistor TR2, and stores the voltage while the light emitting device LED emits light. The voltage level of the gate electrode of TR2) can be maintained constant.

The first capacitor electrode ST1 can be integrated with the second gate electrode GE2 of the second transistor TR2. Accordingly, the first capacitor electrode ST1 can be electrically connected to the second gate electrode GE2 of the second transistor TR2 and the first source electrode SE1 of the first transistor TR1.

The second capacitor electrode can be disposed on the first capacitor electrode ST1 with the first passivation layer 113 interposed therebetween. The second capacitor electrode ST2 can be integrated with the second source electrode SE2 of the second transistor TR2 and the third source electrode SE3 of the third transistor TR3. Accordingly, the second capacitor electrode ST2 can be electrically connected to the second transistor TR2 and the third transistor TR3.

Meanwhile, the first source electrode (SE1), the first drain electrode (DE1), the second source electrode (SE2), the second drain electrode (DE2), the third source electrode (SE3), the third drain electrode (DE3) and a plurality of scan lines SL are disposed on the first passivation layer 113 along with the second capacitor electrode ST2.

The plurality of scan wires (SL) are wires that transmit scan signals to each of the plurality of sub-pixels (SP). The plurality of scan lines SL can transmit scan signals to the first transistor TR1 of each of the plurality of sub-pixels SP. For example, each of the plurality of scan lines SL extends in the row direction and can transmit a scan signal to a plurality of sub-pixels SP arranged in the same row.

Next, the first planarization layer 114 includes a plurality of scan lines (SL), a plurality of reference lines (RL), a plurality of data lines (DL), a first transistor (TR1), a second transistor (TR2), and a plurality of data lines (DL). 3 can be placed on the transistor (TR3) and the storage capacitor (ST). The first planarization layer 114 can planarize the upper part of the substrate 110 on which the plurality of transistors are disposed. The first planarization layer 114 can be composed of a single layer or a double layer, and can be made of, for example, an acryl-based organic material, but is not limited thereto.

A second passivation layer 115 can be disposed on the first planarization layer 114. The second passivation layer 115 is an insulating layer to protect the structure below the second passivation layer 115 and improve the adhesion of the structure formed on the second passivation layer 115, and is made of silicon oxide (SiOx) or it can be composed of a single layer or multiple layers of silicon nitride (SiNx), but is not limited thereto.

On the second passivation layer 115, a second layer (VDD2) of the high potential power supply wiring (VDD), a plurality of first assembly wirings 121 among the plurality of assembly wiring lines 120, and a connection electrode (CE) will be disposed.

First, the plurality of assembly wirings 120 generate an electric field to align the plurality of light-emitting devices (LEDs) when manufacturing the display device 100, and the plurality of light-emitting devices (LEDs) are aligned when the display device 100 is driven. It can be wiring that supplies a low-potential power supply voltage. Accordingly, the assembly wiring 120 can be referred to as a low-potential power wiring. The plurality of assembled wires 120 are arranged in a column direction along the plurality of sub-pixels SP arranged on the same line. The plurality of assembled wires 120 can be arranged to overlap the plurality of sub-pixels SP arranged in the same column. For example, one first assembly wiring 121 and a second assembly wiring 122 are disposed in the red sub-pixel (SPR) arranged in the same column, and one first assembly wiring (122) is disposed in the green sub-pixel (SPG). 121) and a second assembly wiring 122 are disposed, and one first assembly wiring 121 and a second assembly wiring 122 can be disposed in the blue sub-pixel SPB.

The plurality of assembly wiring lines 120 includes a plurality of first assembly wiring lines 121 and a plurality of second assembly wiring lines 122. When the display device 100 is driven, a low-potential voltage can be applied in alternating current to the plurality of first assembly wirings 121 and the plurality of second assembly wirings 122. The plurality of first assembly wires 121 and the plurality of second assembly wires 122 can be alternately arranged. Additionally, in each of the plurality of sub-pixels SP, one first assembly wiring 121 and one second assembly wiring 122 can be disposed adjacent to each other.

The plurality of first assembled wires 121 and the plurality of second assembled wires 122 can be made of a conductive material, for example, copper (Cu) and chromium (Cr), but are not limited thereto.

The plurality of first assembled wires 121 can include a first conductive layer 121a and a first clad layer 121b. The first conductive layer 121a can be disposed on the second passivation layer 115. The first clad layer 121b can be in contact with the first conductive layer 121a. For example, the first clad layer 121b can be disposed to cover the top and side surfaces of the first conductive layer 121a. And the first conductive layer 121a can have a thickness greater than that of the first clad layer 121b.

The first clad layer 121b is made of a material that is more resistant to corrosion than the first conductive layer 121a, and when manufacturing the display device 100, the first conductive layer 121a of the first assembly wiring 121 and the second assembly wiring (Short circuit defects due to migration between the second conductive layers 122a of 122) can be minimized. For example, the first clad layer 121b can be made of molybdenum (Mo), molybdenum titanium (MoTi), etc., but is not limited thereto.

A second layer (VDD2) of the high potential power supply line (VDD) is disposed on the second passivation layer (115). The second layer (VDD2) extends in the column direction between each of the plurality of sub-pixels (SP) and can overlap the first layer (VDD1). The first layer (VDD1) and the second layer (VDD2) can be electrically connected through a contact hole formed in the insulating layers formed between the first layer (VDD1) and the second layer (VDD2). The second layer VDD2 can be formed of the same material and process as the first assembly wiring 121, but is not limited thereto.

A connection electrode (CE) can be disposed in each of the plurality of sub-pixels (SP). The connection electrode CE is electrically connected to the second capacitor electrode ST2 and the second source electrode SE2 of the second transistor TR2 through a contact hole formed in the second passivation layer 115. The connection electrode (CE) is an electrode for electrically connecting the light emitting device (LED) and the second transistor (TR2), which is a driving transistor, and includes a first connection layer (CE1) and a second connection layer (CE2). For example, the first connection layer CE1 can be formed of the same material on the same layer as the first conductive layer 121a of the first assembly wiring 121, and the second connection layer CE2 can be formed of the same material as the first conductive layer 121a of the first assembly wiring 121 and can be formed of the same material as the layer 121b.

Subsequently, a third passivation layer 116 can be disposed on the second layer VDD2, the first assembly wiring 121, and the connection electrode CE. The third passivation layer 116 is an insulating layer to protect the structure below the third passivation layer 116, and can be composed of a single layer or multiple layers of silicon oxide (SiOx) or silicon nitride (SiNx), but is not limited thereto. In addition, the third passivation layer 116 can function as an insulating layer to prevent short circuit defects due to migration between the first assembly wiring 121 and the second assembly wiring 122 when manufacturing the display device 100. This will be described later with reference to FIGS. 5A to 5F.

Among the plurality of assembly wiring lines 120, a plurality of second assembly wiring lines 122 can be disposed on the third passivation layer 116. Each of the plurality of second assembly wirings 122 is disposed in a plurality of sub-pixels (SP) arranged on the same line as described above, and the plurality of first assembly wirings 121 and the plurality of second assembly wirings 122 can be placed spaced apart from each other.

Each of the plurality of second assembled wires 122 includes a second conductive layer 122a and a second clad layer 122b. The second conductive layer 122a is disposed on the third passivation layer 116. And the second clad layer 122b can be electrically connected to the second conductive layer 122a. For example, the second clad layer 122b can be disposed to cover the top and side surfaces of the second conductive layer 122a. And the second conductive layer 122a can have a thickness greater than that of the second clad layer 122b.

The second clad layer 122b is made of a material that is more resistant to corrosion than the second conductive layer 122a, so that short circuit defects occurring due to migration between the first assembly wiring 121 and the second assembly wiring 122 when manufacturing the display device 100 can be minimized. For example, the second clad layer 122b can be made of molybdenum (Mo), molybdenum titanium (MoTi), etc., but is not limited thereto.

Next, the second planarization layer 117 can be disposed on the plurality of second assembly wirings 122. The second planarization layer 117 can be composed of a single layer or a double layer, and can be made of, for example, an acryl-based organic material, but is not limited thereto.

Meanwhile, the second planarization layer 117 includes a plurality of first openings 117a on which each of the plurality of light emitting devices (LEDs) is seated, and a plurality of second openings 117b exposing each of the plurality of connection electrodes (CE).

A plurality of first openings 117a can be disposed in each of the plurality of sub-pixels SP. At this time, more than one first opening 117a can be disposed in one sub-pixel SP. For example, one first opening 117a or two first openings 117a can be disposed in one sub-pixel SP.

The plurality of first openings 117a are parts into which a plurality of light emitting devices (LEDs) are inserted, and can also be referred to as pockets. The plurality of first openings 117a can be formed to overlap the plurality of assembly wirings 120. For example, one first opening 117a can overlap the first assembly wiring 121 and the second assembly wiring 122 disposed adjacent to each other in one sub-pixel SP.

Additionally, a portion of the second clad layer 122b of the plurality of second assembly wirings 122 can be exposed through the first opening 117a. On the other hand, since the third passivation layer 116 covers all of the first assembly wiring 121 in the first opening 117a, the first assembly wiring 121 overlaps the first opening 117a, but the first assembly wiring 121 overlaps the first opening 117a and cannot be exposed in first opening 117a.

A plurality of second openings 117b can be disposed in the plurality of sub-pixels SP. The plurality of second openings 117b can be portions that expose the connection electrodes CE of each of the plurality of sub-pixels SP. The connection electrode (CE) under the second planarization layer 117 is exposed through the plurality of second openings 117b, can be electrically connected to the light emitting device (LED), and can receive a driving current from the second transistor (TR2) and the driving current can be delivered through a light emitting device (LED). At this time, the third passivation layer 116 can have a contact hole in the area overlapping the second opening 117b, and the connection electrode CE is formed from the second planarization layer 117 and the third passivation layer 116 can be exposed.

A plurality of light emitting devices (LEDs) can be disposed in the plurality of first openings 117a. The plurality of light emitting devices (LEDs) are light emitting devices (LEDs) that emit light by electric current. The plurality of light emitting devices (LEDs) can include light emitting devices (LEDs) that emit red light, green light, blue light, etc., and a combination of these can produce light of various colors, including white. For example, the light emitting device (LED) can be a light emitting diode (LED) or a micro LED, but is not limited thereto.

Hereinafter, a plurality of light-emitting devices (LEDs) are arranged in the red sub-pixel (SPR), the red light-emitting device 130, the green light-emitting device 140 located in the green sub-pixel (SPG), and the blue sub-pixel (SPB). The description will be made assuming that the blue light emitting device 150 is included. However, the plurality of light emitting devices (LEDs) are composed of light emitting devices (LEDs) that emit light of the same color, and a separate light conversion member is used to convert the light from the plurality of light emitting devices (LEDs) into light of different colors. Thus, images in various colors can be displayed, but are not limited to this.

The plurality of light-emitting devices (LEDs) 150 include a red light-emitting device 130 disposed in the red sub-pixel (SPR), a green light-emitting device 140 disposed in the green sub-pixel (SPG), and a blue light-emitting device 140 disposed in the blue sub-pixel (SPB). Each of the red light-emitting device 130, the green light-emitting device 140, and the blue light-emitting device 150 can include a first semiconductor layer, a second semiconductor layer, a first electrode, and a second electrode in common. And the red light-emitting device 130 includes a light-emitting layer that emits red light, the green light-emitting device 140 includes a light-emitting layer that emits green light, and the blue light-emitting device 150 includes a light-emitting layer that emits blue light.

Referring to FIG. 3, the red light-emitting device 130 disposed in the red sub-pixel (SPR) can have a second semiconductor layer 133 disposed on the first semiconductor layer 131. The first semiconductor layer 131 and the second semiconductor layer 133 can be layers formed by doping n-type and p-type impurities into a specific material. For example, the first semiconductor layer 131 and the second semiconductor layer 133 can include an AlInGaP-based semiconductor layer, for example, indium aluminum phosphide (InAlP), gallium arsenide (GaAs), etc and can be a layer doped with type or n-type impurities. The p-type impurities can be magnesium (Mg), zinc (Zn), beryllium (Be), etc., and the n-type impurities can be silicon (Si), germanium (Ge), tin (Sn), etc., but are not limited thereto. No.

A light emitting layer 132 that emits red light is disposed between the first semiconductor layer 131 and the second semiconductor layer 133. The light emitting layer 132 can emit light by receiving holes and electrons from the first semiconductor layer 131 and the second semiconductor layer 133. The light-emitting layer 132 can have a single-layer or multi-quantum well (MQW) structure.

The light emitting layer 132 can convert injected electrical energy into light with a specific wavelength within the range of about 570 nm to about 630 nm. The change in specific wavelength is determined by the size of the band gap of the light emitting diode. The band gap size can be adjusted by changing the composition ratio of Al and Ga. For example, as the composition ratio of Al increases, the wavelength becomes shorter.

The first electrode 134 can be disposed on the lower surface of the first semiconductor layer 131, and the second electrode 135 can be disposed on the upper surface of the second semiconductor layer 133. The first electrode 134 is an electrode bonded to the second assembly wiring 122 exposed through the first opening 117*a*, and the second electrode 135 is a pixel electrode (PE) and a second semiconductor layer 133 to be described later. The first electrode 134 and the second electrode 135 can be formed of a conductive material.

At this time, in order to bond the first electrode 134 to the second assembly wiring 122, the first electrode 134 can be made of a eutectic metal. For example, the first electrode 134 is made of tin (Sn), indium (In), zinc (Zn), lead (Pb), nickel (Ni), gold (Au), platinum (Pt), and copper (Cu), but is not limited to, etc.

And both the green light-emitting device 140 and the blue light-emitting device 150 can be formed with the same or similar structure as the red light-emitting device 130. For example, the green light-emitting device 140 includes a first electrode, a first semiconductor layer on the first electrode, a green light-emitting layer on the first semiconductor layer, a second semiconductor layer on the green light-emitting layer, and a second electrode on the second semiconductor layer. The blue light emitting device can also include a structure in which a first electrode, a first semiconductor layer, a blue light emitting layer, a second semiconductor layer, and a second electrode are sequentially stacked.

However, the green light-emitting device 140 and the blue light-emitting device 150 can be formed of a compound selected from the group consisting of GaN, AlGaN, InGaN, AlInGaN, GaP, AlN, GaAs, AlGaAs, InP, and mixtures thereof, but it is not limited to this.

Meanwhile, although not shown in the drawing, an insulating layer surrounding a portion of each of the plurality of light emitting devices (LEDs) can be disposed. Specifically, the insulating layer can cover at least one side of the light emitting device (LED) among the outer surfaces of the plurality of light emitting devices (LED). An insulating layer is formed on the light emitting device (LED) to protect the light emitting device (LED), and when forming the first electrode 134 and the second electrode 135, the first semiconductor layer 131 and the second semiconductor layer 133, electrical short circuit can be prevented.

Next, the third planarization layer 118 can be disposed on the plurality of light emitting devices (LEDs). The third planarization layer 118 can planarize the upper part of the substrate 110 on which the plurality of light-emitting devices (LEDs) are disposed, and the plurality of light-emitting devices (LEDs) are formed through the third planarization layer 118 through the first opening 117*a*. The third planarization layer 118 can be composed of a single layer or a double layer, and can be made of, for example, an acryl-based organic material, but is not limited thereto.

The pixel electrode PE can be disposed on the third planarization layer 118. The pixel electrode (PE) can be an electrode for electrically connecting a plurality of light emitting devices (LED) and the connection electrode (CE). The pixel electrode (PE) can be electrically connected to the light emitting device (LED) of the first opening (117*a*) and the connection electrode (CE) of the second opening (117*b*) through a contact hole formed in the third planarization layer (118). Accordingly, the second electrode 135 of the light emitting device (LED), the connection electrode (CE), and the second transistor (TR2) can be electrically connected through the pixel electrode (PE).

Referring to FIGS. 2 and 4 together, a plurality of assembly wiring connection patterns 120P can be disposed on the third planarization layer 118. The plurality of assembly wiring connection patterns 120P can be a pattern that electrically connects the plurality of first assembly wirings 121 and the plurality of second assembly wirings 122 to each other. The assembly wiring connection pattern 120P can be disposed in each of the plurality of sub-pixels SP and connected to the first assembly wiring 121 and the second assembly wiring 122 adjacent to each other.

For example, one assembly wiring connection pattern 120P is disposed in one red sub-pixel (SPR), and one end of the assembly wiring connection pattern 120P is formed with the third planarization layer 118 and the second planarization layer 117. And the first assembly wiring 121 of the red sub-pixel (SPR) through a contact hole formed in the third passivation layer 116, and the other end of the assembly wiring connection pattern 120P is the third planarization layer 118 can be connected to the second assembly wiring 122 of the red sub-pixel (SPR) through a contact hole formed in the second planarization layer 117. At this time, the assembly wiring connection pattern 120P can be disposed in an area where the pixel electrode PE is not disposed in each of the plurality of sub-pixels SP.

The first assembly wiring 121 and the second assembly wiring 122 can have the same potential through the assembly wiring connection pattern 120P. That is, a low-potential alternating current voltage can be applied to all of the first assembly wiring 121, the second assembly wiring 122, and the assembly wiring connection pattern 120P. At this time, as the assembly wiring connection pattern 120P connects the two adjacent assembly wirings 120, the resistance in the first assembly wiring 121 and the second assembly wiring 122 can be improved, and the voltage drop can be reduced. There is a technical effect that can reduce the phenomenon.

The third layer (VDD3) of the high potential power line (VDD) can be disposed on the third planarization layer (118). The third layer (VDD3) can electrically connect the first layer (VDD1) and the second layer (VDD2) arranged in different rows. For example, the third layer (VDD3) extends in the row direction between the plurality of sub-pixels (SP), and connects the plurality of second layers (VDD2) of the high potential power supply line (VDD) extending in the column direction to each other electrically connected with. In addition, as the plurality of high-potential power supply lines (VDD) are connected in a mesh form through the third layer (VDD3), there is a technical effect of reducing the voltage drop phenomenon.

The black matrix BM can be disposed on the third planarization layer 118. The black matrix BM can be disposed between the plurality of sub-pixels SP on the third planarization layer 118. The black matrix (BM) can reduce color mixing between the plurality of sub-pixels (SP). The black matrix (BM) can be made of an opaque material, for example, black resin, but is not limited thereto.

A protective layer 119 is disposed on the pixel electrode (PE), the third planarization layer 118, and the black matrix (BM). The protective layer 119 is a layer to protect the structure below the protective layer 119, and can be composed of a single layer or multiple layers of translucent epoxy, silicon oxide (SiOx), or silicon nitride (SiNx), but is not limited thereto.

Meanwhile, in the first opening 117a, the plurality of first assembly wirings 121 are spaced apart from the plurality of light emitting devices (LED), and only the plurality of second assembly wirings 122 are in contact with the plurality of light emitting devices (LED). This is to prevent defects that occur when a plurality of light emitting devices (LEDs) come into contact with both the first assembly wiring 121 and the plurality of second assembly wiring 122 during the manufacturing process of the display device 100. A third passivation layer 116 can be formed on the first assembly wiring 121, and a plurality of light emitting devices (LEDs) can be contacted only to the plurality of second assembly wirings 122.

Hereinafter, a method of manufacturing the display device 100 according to an embodiment will be described in detail with reference to FIGS. 5A to 5F.

FIGS. 5A to 5F are process diagrams for explaining a manufacturing method of a display device according to an embodiment. FIGS. 5A and 5B are process diagrams for explaining a process of self-assembling a plurality of light emitting devices (LEDs) into the first opening 117a. FIG. 5C is a schematic plan view of the mother substrate 10 used for self-assembly of a plurality of light emitting devices (LEDs). FIG. 5D is a diagram schematically showing the electrical connection relationship between the plurality of assembly wires 120 and the assembly pad PD. FIG. 5E is a schematic plan view of a plurality of substrates 110 formed by scribing the mother substrate 10 after self-assembly of a plurality of light emitting devices (LEDs) is completed. FIG. 5F is a schematic cross-sectional view of area X in FIG. 5E.

Referring to FIG. 5A, a light emitting device (LED) is introduced into the chamber (CB) filled with the fluid (WT). The fluid WT can include water, etc., and the chamber CB filled with the fluid WT can have an open top.

Next, the mother substrate 10 can be placed on the chamber (CB) filled with light emitting devices (LED). The mother substrate 10 is a substrate composed of a plurality of substrates 110 forming the display device 100, and when self-assembling a plurality of light emitting devices (LEDs), a plurality of assembly wirings 120 and a second planarization layer 117 are can be used.

Then, the mother substrate 10 formed with the first assembly wiring 121, the second assembly wiring 122, and the second planarization layer 117 is placed on the chamber CB or inserted into the chamber CB. At this time, the mother substrate 10 can be positioned so that the first opening 117a of the second planarization layer 117 and the fluid WT face each other.

Next, the magnet MG can be placed on the mother substrate 10. Light emitting devices (LEDs) that sink or float on the bottom of the chamber (CB) can move toward the mother substrate 10 by the magnetic force of the magnet (MG).

At this time, the light emitting device (LED) can include a magnetic material to move by a magnetic field. For example, the first electrode 134 or the second electrode 135 of the light emitting device (LED) can include a ferromagnetic material such as iron, cobalt, or nickel.

Next, the light emitting device (LED) moved toward the second planarization layer 117 by the magnet MG can be self-assembled through the first opening 117a.

An alternating voltage can be applied to the plurality of first assembly wirings 121 and the plurality of second assembly wirings 122 to generate an electric field. Due to this electric field, the light emitting device (LED) is dielectrically polarized and can have polarity. And a dielectric polarized light emitting device (LED) can be moved or fixed in a specific direction by dielectrophoresis (DEP), that is, an electric field. Therefore, a plurality of light emitting devices (LEDs) can be fixed within the first opening 117a of the second planarization layer 117 using dielectrophoresis.

Next, the mother substrate 10 is rotated at 180 with the light-emitting device (LED) fixed within the first opening 117a using the electric fields of the plurality of first assembly wirings 121 and the plurality of second assembly wirings 122. In the embodiment, the mother substrate 10 can be turned over and a subsequent process can be performed while voltage is applied to the plurality of first assembly wirings 121 and the plurality of second assembly wirings 122.

And with the first electrode 134 of the light emitting device (LED) located on the second assembly wiring 122, heat and pressure are applied to the light emitting device (LED) to connect the light emitting device (LED) to the second assembly wiring 122. For example, the first electrode 134 of the light emitting device (LED) can be bonded to the second assembly wiring 122 through eutectic bonding. Eutectic bonding is a bonding method using heat compression at high temperatures and is one of the bonding processes that is very strong and highly reliable. The eutectic bonding method not only realizes high bonding strength, but also has the advantage of eliminating the need to apply a separate adhesive from the outside. However, the bonding method of the plurality of light emitting devices (LEDs) can be configured in various ways other than eutectic bonding, but is not limited thereto.

Meanwhile, different voltages are applied to the plurality of first assembly wirings 121 and the plurality of second assembly wirings 122 when manufacturing the display device 100, but the same voltage can be applied when driving the display device 100. To this end, when manufacturing the display device 100, the plurality of first assembly wirings 121 and the plurality of second assembly wirings 122 can be connected to different assembly pads PD and different voltages can be applied.

In this regard, referring to FIG. 5C, when manufacturing the display device 100, in the state of the mother substrate 10, the assembly wiring 120 on the plurality of substrates 110 is connected to the assembly pad (PD) outside the plurality of substrates 110. Specifically, a plurality of substrates 110 forming the display device 100, a plurality of assembly pads PD, and a plurality of assembly wiring connection parts PL are disposed on the mother substrate 10.

The plurality of assembly pads PD are pads for applying voltage to the plurality of assembly wirings 120, and are electrically connected to the plurality of assembly wirings 120 disposed on each of the plurality of substrates 110 forming the mother substrate 10. A plurality of assembly pads (PD) can be formed on the mother substrate 10 outside the substrate 110 of the display device 100, and when the manufacturing process of the display device 100 is completed, the substrate (PD) of the display device 100 110) and can be separated from. For example, when two substrates 110 are formed on the mother substrate 10, the plurality of first assembly wirings 121 disposed on each substrate 110 are connected to one assembly pad PD. And, the plurality of second assembly wires 122 can be connected to other assembly pads PD.

Therefore, after placing the mother substrate 10 in the chamber CB into which a plurality of light emitting devices (LEDs) are inserted, an alternating voltage is applied to the plurality of assembly wirings 120 through the plurality of assembly pads PD to create an electric field and a plurality of light emitting devices (LEDs) can be easily self-assembled into the first opening 117a of the second planarization layer 117.

Meanwhile, when self-assembling a plurality of light emitting devices (LEDs) for each of a plurality of sub-pixels (SP), a plurality of assembly lines 120 arranged in a plurality of red sub-pixels (SPR), a plurality of green sub-pixels (SPG) The plurality of assembly wires 120 arranged in and the plurality of assembly wires 120 arranged in the plurality of blue sub-pixels SPB can be connected to different assembly pads PD.

In this case, the plurality of assembly pads PD include the first assembly pad PD1, the second assembly pad PD2, the third assembly pad PD3, the fourth assembly pad PD4, and the fifth assembly pad PD5 and a sixth assembly pad PD6.

The first assembly pad PD1 is a pad for applying voltage to the plurality of first assembly wirings 121 disposed in the plurality of red sub-pixels (SPR) on the mother substrate 10. The fourth assembly pad PD4 is a pad for applying voltage to the plurality of second assembly wirings 122 disposed in the plurality of red sub-pixels SPR on the mother substrate 10.

The second assembly pad PD2 is a pad for applying voltage to the plurality of first assembly wirings 121 disposed in the plurality of green sub-pixels (SPG) on the mother substrate 10. The fifth assembly pad PD5 is a pad for applying voltage to the plurality of second assembly wirings 122 disposed in the plurality of green sub-pixels (SPG) on the mother substrate 10.

The third assembly pad PD3 is a pad for applying voltage to the plurality of first assembly wirings 121 disposed in the plurality of blue sub-pixels (SPB) on the mother substrate 10. The sixth assembly pad PD6 is a pad for applying voltage to the plurality of second assembly wirings 122 disposed in the plurality of blue sub-pixels SPB on the mother substrate 10.

Through these plurality of assembly pads (PD), the light emitting device (LED) can be selectively self-assembled only in a specific subpixel (SP) among the plurality of subpixels (SP). For example, when self-assembling the light emitting device (LED) only to a plurality of red sub-pixels (SPR), the light-emitting device (LED) is self-assembled to the plurality of red sub-pixels (SPR) through the first assembly pad (PD1) and the fourth assembly pad (PD4). Voltage can be applied only to the plurality of first assembly wirings 121 and the plurality of second assembly wirings 122 arranged.

The assembly wiring connecting portion PL is a wiring connecting the plurality of assembly wirings 120 and the plurality of assembly pads PD on each substrate 110. The assembly wiring connection portion PL has one end connected to a plurality of assembly pads PD and the other end extending onto the plurality of substrates 110 to form a plurality of first assembly wiring lines 121 and a plurality of second assembly wiring lines 122. The assembly wiring connection part PL includes a first connection part PL1, a second connection part PL2, a third connection part PL3, a fourth connection part PL4, a fifth connection part PL5, and a sixth connection part PL6.

The first connection portion PL1 is a wiring that electrically connects the first assembly wiring 121 disposed in the plurality of red sub-pixels SPR on the mother substrate 10 and the first assembly pad PD1. The fourth connection part PL4 is a wire that electrically connects the second assembly wire 122 and the fourth assembly pad PD4 disposed in the plurality of red sub-pixels SPR on the mother substrate 10. For example, the other end of the first connection part PL1 extends to each of the plurality of substrates 110, and a plurality of first assembly lines 121 are disposed on and can be electrically connected to the red sub-pixels SPR of each of the plurality of substrates 110. For example, the other end of the fourth connection portion PL4 extends to each of the plurality of substrates 110, and a plurality of second assembly lines 122 are disposed on and can be electrically connected to the red sub-pixels SPR of each of the plurality of substrates 110.

The second connection portion PL2 is a wiring that electrically connects the first assembly wiring 121 and the second assembly pad PD2 disposed in the plurality of green sub-pixels SPG on the mother substrate 10. The fifth connection portion PL5 is a wiring that electrically connects the second assembly wiring 122 and the fifth assembly pad PD5 disposed in the plurality of green sub-pixels SPG on the mother substrate 10.

The third connection part PL3 is a wire that electrically connects the first assembly wire 121 and the third assembly pad PD3 disposed in the plurality of blue sub-pixels SPB on the mother substrate 10. The sixth connection portion PL6 is a wiring that electrically connects the second assembly wiring 122 and the sixth assembly pad PD6 disposed in the plurality of blue sub-pixels SPB on the mother substrate 10.

At this time, the plurality of first assembly wirings 121 disposed on one substrate 110 are connected into one, and the plurality of second assembly wirings 122 are also connected into one to form a plurality of first assembly wirings 121 and a plurality of plurality of assembly wirings 121. Each of the second assembly wires 122 can be easily connected to the assembly wire connection portion PL.

For example, referring to FIG. 5D, the first assembly wiring 121 disposed in a plurality of red sub-pixels (SPR) on one substrate 110 is a link wiring in the non-display area (NA) of the substrate 110. The second assembly wiring 122, which is connected as one through (LL) and arranged in a plurality of red sub-pixels (SPR), can also be connected as one through a link wiring (LL) in the non-display area (NA) of the substrate 110.

In this case, each of the plurality of first assembly wirings 121 and the plurality of second assembly wirings 122 disposed on one substrate 110 are not individually connected to the assembly wiring connecting portion PL, and the non-display area In (NA), a link wire (LL) connecting each of the plurality of first assembly wirings 121 and a plurality of second assembly wirings 122 into one and an assembly wiring connection portion (PL) are connected to form a plurality of first assembly wirings (121) and the plurality of second assembly wires 122, a voltage for self-assembly of the light emitting device (LED) can be easily applied.

Meanwhile, the assembly wiring connection portion PL can be formed of the same material and the same process as the plurality of assembly wiring 120, or can be formed of different materials and processes. Additionally, the assembly wiring connection part PL can have a single-layer structure or a multi-layer structure, but is not limited thereto.

In addition, the assembly wiring connection portion (PL) and assembly pad (PD) shown in FIGS. 5C and 5D are exemplary, and the arrangement and shape of the assembly wiring connection portion (PL) and assembly pad (PD) and the number or sequence of the self-assembly process, can vary depending on the design of the plurality of sub-pixels (SP).

Next, referring to FIGS. 5E and 5F, after the self-assembly process of the plurality of light emitting devices (LEDs) is completed, the mother substrate 10 is cut along the scribing line (SCL) to form the plurality of substrates 110 and can be separated. In addition, when scribing the mother board 10, a portion of the assembly wiring connecting portion PL connecting the plurality of assembly wirings 120 and the plurality of assembly pads PD at the edge of the substrate 110 can be cut. Accordingly, the cut surface of the assembly wiring connection portion PL can be confirmed on the cut surface of the substrate 110.

For example, in area A cross section of the assembly wiring connection portion (PL) disposed between (IL) can be confirmed. A first connection portion PL1 connecting the first assembly wiring 121 of the plurality of red sub-pixels (SPR) between the plurality of insulating layers IL, and the first assembly wiring 121 of the plurality of green sub-pixels (SPG) and the third connection part PL3 connecting the first assembly lines 121 of the plurality of blue sub-pixels SPB can be seen.

Next, after scribing the mother substrate 10 to separate it into a plurality of substrates 110, a link wiring LL connecting the plurality of first assembly wirings 121 into one and a plurality of second assembly wirings. The same voltage can be easily applied to the plurality of first assembly wirings 121 and the plurality of second assembly wirings 122 through the link wiring LL connecting the wirings 122. For example, when driving the display device 100, the link wire LL connecting each of the plurality of first assembly wires 121 and the plurality of second assembly wires 122 into one in the non-display area NA is driven. By connecting the IC, voltage can be applied to the plurality of first assembly wirings 121 and the plurality of second assembly wirings 122.

In the display device 100 according to the embodiment, at least a portion of the plurality of assembly wirings 120 for self-assembly of the plurality of light emitting devices (LEDs) are used as wiring for applying a low-potential power supply voltage to the plurality of light emitting devices (LEDs).

When manufacturing the display device 100, a plurality of light emitting devices (LEDs) floating in the fluid WT can be moved adjacent to the mother substrate 10 using a magnetic field. Subsequently, different voltages can be applied to the plurality of first assembly wirings 121 and the plurality of second assembly wirings 122 to form an electric field, and the plurality of light emitting devices (LEDs) can be self-assembled within the opening 117a.

At this time, instead of separately forming a wiring supplying a low-potential voltage and connecting it to a plurality of self-assembled light emitting devices (LEDs), light is emitted through the second assembly wiring 122, a portion of which is exposed within the first opening 117a. By bonding the first electrode 134 of the device (LED), the plurality of assembly wirings 120 can be used as wiring for supplying low-potential voltage to the plurality of light emitting devices (LED) when the display device 100 is driven.

Therefore, in the display device 100 according to the embodiment, the plurality of assembly wirings 120 can be used not only as self-assembly of the plurality of light emitting devices (LED), but also as wiring for driving the plurality of light emitting devices (LED).

In the display device 100 according to the embodiment, the plurality of assembled wires 120 include a clad layer, so that corrosion of the plurality of assembled wires 120 or short circuit defects can be reduced. The plurality of first assembled wires 121 can include a first conductive layer 121a and a first clad layer 121b surrounding the first conductive layer 121a and being more resistant to corrosion than the first conductive layer 121a.

In addition, the plurality of second assembly wirings 122 can include a second conductive layer 122a and a second clad layer 122b surrounding the second conductive layer 122a that is more resistant to corrosion than the second conductive layer 122a. When manufacturing the display device 100, the mother substrate 10 on which the plurality of assembly wirings 120 are formed is placed in the fluid WT to self-assemble the plurality of light emitting devices (LEDs).

In this case, the first conductive layer 121a and/or the second conductive layer 122a can be exposed in the fluid WT and the assembly wiring 120 can be corroded, which can cause a short circuit defect. Therefore, the first conductive layer 121a of the plurality of first assembly wirings 121 can be wrapped with the second passivation layer 115 and the first clad layer 121b, and the plurality of second assembly wirings 122 can be wrapped. The second conductive layer 122a can be wrapped with the third passivation layer 116 and the second clad layer 122b.

Accordingly, the plurality of assembled wires 120 are formed in a structure including the first clad layer 121b and the second clad layer 122b, which has a technical effect of improving the reliability of the plurality of assembled wires 120.

In the display device according to the embodiment, the resistance of the plurality of assembled wires 120 can be improved by forming the assembled wire connection pattern 120P. Specifically, an assembly wiring connection pattern 120P is disposed in each of the plurality of sub-pixels SP.

The assembly wiring connection pattern 120P can electrically connect the first assembly wiring 121 and the second assembly wiring 122 disposed in one sub-pixel, and the first assembly wiring 121 and the second assembly wiring 122 and the assembly wiring connection pattern 120P can have the same potential. As the second assembly wiring 122, which transmits a low-potential power supply voltage to a plurality of light emitting devices (LEDs), is connected to the assembly wiring connection pattern 120P and the first assembly wiring 121, the resistance of the assembly wiring 120 decreases. There is a technical effect that can be improved and the voltage drop phenomenon in the assembly wiring 120 can be improved.

Therefore, in the display device 100 according to the embodiment, an assembly wiring connection pattern 120P is formed to electrically connect the first assembly wiring 121 and the second assembly wiring 122 to reduce the resistance of the assembly wiring 120. There is a technical effect that can improve and reduce power consumption.

FIG. 6 is a cross-sectional view of a display device according to a second embodiment. FIG. 7 is a cross-sectional view taken along line VII-VII' of FIG. 6. The display device 600 of FIGS. 6 and 7 differs from the display device 100 of FIGS. 1 to 4 only in the assembly wiring connection pattern 620P, and other configurations are substantially the same, so duplicate descriptions will be omitted.

Referring to FIG. 6, assembly wiring connection patterns 620P disposed in each of the plurality of sub-pixels SP can be connected to each other. The assembly wiring connection patterns 620P disposed in adjacent sub-pixels SP can be connected to each other and formed as one body. The assembly wiring connection pattern 620P can extend in the row direction like the scan wiring SL, and can be disposed across the sub-pixels SP arranged in the same row.

The first assembly wiring 121 and the second assembly wiring 122 disposed in the plurality of sub-pixels SP can be electrically connected to each other by the assembly wiring connection pattern 620P. For example, all of the first assembly wiring 121 and the second assembly wiring 122 arranged in each of the red sub-pixel (SPR), green sub-pixel (SPG), and blue sub-pixel (SPB) arranged in the same row and can be electrically connected by one assembly wiring connection pattern (620P).

Additionally, in the display device 600 according to the second embodiment, the voltage drop phenomenon can be improved by forming an assembly wiring connection pattern 620P that electrically connects the assembly wiring 120 disposed in the plurality of sub-pixels SP. There are technical effects that can be achieved.

The assembly wiring connection patterns 620P disposed in each of the plurality of sub-pixels SP can be connected to each other. That is, the assembly wiring connection patterns 620P disposed in the plurality of sub-pixels SP can be formed as one piece. At this time, the assembly wiring connection pattern 620P can electrically connect both the first assembly wiring 121 and the second assembly wiring 122 disposed in each of the plurality of sub-pixels SP.

A plurality of assembly wires 120 can be connected in a mesh form by the assembly wire connection pattern 620P. Therefore, in the display device 600 according to the second embodiment, an assembly wiring connection pattern 620P is formed to connect the plurality of assembly wirings 120 in a mesh form to reduce the voltage drop according to the resistance in the plurality of assembly wirings 120. There is a technological effect that can improve the phenomenon.

FIG. 8 is a cross-sectional view of the display device 200 according to the third embodiment. The display device 200 of FIG. 8 is different from the display device according to the embodiment of FIG. 3 only in the first assembly wiring 221 and the second assembly wiring 222, and other configurations are substantially the same, so duplicate description is required. is omitted.

According to undisclosed internal technology, DEP Force is required for self-assembly, but due to the difficulty in uniformly controlling the DEP Force, problems arise where the light emitting device is tilted or tilted to a place other than the correct position within the assembly hall when assembling using self-assembly.

In addition, there is a problem in that the electrical contact characteristics are deteriorated in the electrical contact process due to tilting or tilting of the light emitting device, resulting in a decrease in the lighting rate.

Therefore, according to undisclosed internal technology, DEP Force is required for self-assembly, but when DEP Force is used, it faces a technical contradiction in that the electrical contact characteristics are deteriorated due to the tilting phenomenon of the semiconductor light emitting device.

For example, in the assembled electrode structure according to internal technology, a passivation layer, which is an insulating film, is interposed between the first assembled electrode and the second assembled electrode, and self-assembly is in progress with only one of them exposed. However, since the assembled electrode structure is asymmetric, the electric field distribution is also asymmetrical, which can be biased to one side when assembling a semiconductor light emitting device. The bonding area between the assembled electrode exposed to the insulating film and the bonding metal of the light emitting device is small, so as the light emitting chip becomes smaller, the signal is applied. There is something difficult about it.

Referring to FIG. 8, the first assembly wiring 221 can be disposed in the second passivation layer 115 and the second assembly wiring 222 can be disposed in the third passivation layer 116. And a portion of the second assembly wiring 222 can be in contact with the light emitting device (LED).

Additionally, portions of the first assembly wiring 221 and the second assembly wiring 222 can overlap in the vertical direction and can be very close to each other in the horizontal direction.

At this time, the first assembly wiring 221 and the second assembly wiring 222 cannot be located on the same plane. Additionally, the second assembly wiring 222 can extend beyond the center HC of the assembly hole where the light emitting device LED is assembled.

In this case, even if the light emitting device (LED) is tilted due to an imbalance in the electric field, the second assembly wiring 222 can contact the lower surface of the light emitting device (LED), and the second assembly wiring 222 and the light emitting device, so there is a technical effect of securing electrical reliability by securing a sufficient contact area of the LED.

Additionally, the second assembly wiring 222 can support a light emitting device (LED). Additionally, since the first assembly wiring 221 and the second assembly wiring 222 do not overlap in the horizontal direction and do not contact each other, an electrical short circuit does not occur.

FIG. 9 is a cross-sectional view of the display device 300 according to the fourth embodiment. The display device 300 of FIG. 9 has only different assembly wiring compared to the display device according to the embodiment of FIG. 3, but other configurations are substantially the same, so redundant description will be omitted.

Referring to FIG. 9, the first clad layer 321b of the plurality of first assembly wirings 321 can extend from the first conductive layer 321a toward the second assembly wiring 322. Additionally, the second clad layer 322b of the plurality of second assembly wirings 322 can extend from the second conductive layer 322a toward the first assembly wiring 321.

In the fourth embodiment, the first clad layer 321*b* and the second clad layer 322*b* are disposed with the third passivation layer 116 therebetween, and can overlap top and bottom.

Meanwhile, the second clad layer 322*b* can have a predetermined electrode hole 323 in an area overlapping with the light emitting device (LED) and the first clad layer 321*b*. The size of the electrode hole 323 can be smaller than the size of the light emitting device (LED).

Additionally, an alternating current voltage can be applied to the first clad layer 321*b* and the second clad layer 322*b* to generate an electric field.

The DEP force caused by this electric field can be concentrated in the electrode hole 323 provided in the second clad layer 322*b*.

The light emitting device (LED) can be self-assembled within the first opening 117*a* by concentrated dielectrophoretic force (DEP force).

There is a technical effect of strengthening the assembly force for the light emitting device (LED) due to the plurality of assembly wirings 321 and 322 being vertically overlapped. In addition, the first opening 117*a* does not vertically overlap the first conductive layer 321*a* and the second conductive layer 322*a*, which has the technical effect of reducing the thickness of the panel.

Meanwhile, the second clad layer 322*b* can be disposed below the light emitting device (LED).

Additionally, the second clad layer 322*b* can be in contact with the first electrode 134 of the light emitting device (LED).

Therefore, as the second clad layer 322*b* is disposed on the lower surface of the first electrode 134 of the light emitting device (LED), the light emitting device (LED) is supported uniformly and a wide electrical contact area is secured between the light emitting devices (LED) to enable carrier injection. There is a complex technical effect of improved efficiency, improved luminous efficiency, and improved brightness.

The display device including the semiconductor light emitting device according to the above-described embodiment has the technical effect of utilizing self-assembly wiring as a wiring for driving the light emitting device.

Additionally, the embodiment has the technical effect of minimizing defects that occur during self-assembly or bonding of light-emitting devices by improving the structure of a plurality of assembly wires.

Additionally, the embodiment has the technical effect of minimizing corrosion and short circuit defects in a plurality of assembly wiring.

For example, corrosion of the conductive layer can be prevented by using a corrosion-resistant clad layer.

Additionally, the embodiment has the technical effect of improving the resistance of a plurality of assembly wiring.

For example, by connecting a plurality of assembled wires using an assembled wire connection pattern, each assembled wire can obtain the same potential and improve resistance.

Additionally, the embodiment has the technical effect of strengthening the assembly force of the light emitting device by arranging a plurality of assembly wirings in a vertically symmetrical structure.

In addition, the embodiment can solve the problem of tilting of the light emitting device by supporting the light emitting device with one assembly wiring.

In addition, the embodiment supports the light-emitting device evenly by arranging the first assembly wiring and the second assembly wiring to overlap between the top and bottom thereof, and at the same time secures a wide electrical contact area between the assembly wiring and the electrode layer of the light-emitting device, thereby improving carrier injection efficiency. So, there is a complex technical effect of improved luminous efficiency and improved brightness.

The above detailed description should not be construed as restrictive in any respect and should be considered illustrative. The scope of the embodiments should be determined by reasonable interpretation of the appended claims, and all changes within the equivalent scope of the embodiments are included in the scope of the embodiments.

EXPLANATION OF REFERENCES

10: Ledger board
AA: display area
NA: Non-display area
SP: Sub pixel
SPR: Red sub-pixel
SPG: Green sub-pixel
SPB: Blue sub-pixel
100 200, 300, 500, 600, 700, 800: Display device
110: substrate
111: buffer layer
112: Gate insulating layer
113: first passivation layer
114: first planarization layer
115: second passivation layer
116: Third passivation layer
117: second planarization layer
117*a*: first opening
117*b*: second opening
118: Third planarization layer
119: protective layer
120, 220, 320: Assembly wiring
121, 221, 321: first assembly wiring
121*a*, 221*a*, 321*a*: first conductive layer
121*b*, 221*b*, 321*b*: first clad layer
122, 222, 322: second assembly wiring
122*a*, 222*a*, 322*a*: second conductive layer
122*b*, 222*b*, 322*b*: second clad layer
323: electrode hole
HC: Center of assembly hall
LED: light emitting device
130: Red light emitting device
131: first semiconductor layer
132: light emitting layer
133: second semiconductor layer
134: first electrode
135: second electrode
140: Green light-emitting device
150: Blue light emitting device
LS: light blocking layer
SL: scan wiring
DL: data wiring
RL: Reference wiring
VDD: High potential power wiring
VDD1: first layer
VDD2: Second layer
VDD3: Third layer
TR1: first transistor
ACT1: first active layer
GE1: first gate electrode
SE1: first source electrode
DE1: first drain electrode
TR2: second transistor ACT2: second active layer
GE2: second gate electrode
SE2: second source electrode
DE2: second drain electrode
TR3: third transistor
ACT3: Third active layer
GE3: third gate electrode
SE3: third source electrode
DE3: third drain electrode, DE2: second drain electrode
TR3: third transistor
ACT3: Third active layer
GE3: third gate electrode
SE3: third source electrode
DE3: third drain electrode
ST: storage capacitor
ST1: first capacitor electrode
ST2: second capacitor electrode
CE: connecting electrode
CE1: first connecting layer
CE2: second connecting layer
PE: Pixel electrode
BM: Black Matrix
CB: Chamber
WT: fluid
MG: Magnet
PD: assembly pad
PD1: first assembly pad
PD2: Second assembly pad
PD3: Third assembly pad
PD4: Fourth assembly pad
PD5: Fifth assembly pad
PD6: 6th assembly pad
PL: assembly wiring connection
PL1: first connection
PL2: second connection
PL3: third connection
PL4: fourth connection
PL5: Fifth connection
PL6: sixth connection
LL: Link wiring
SCL: Scribing Line
IL: plural insulating layers

INDUSTRIAL APPLICABILITY

Embodiments can be adopted in the field of displays that display images or information.

Embodiments can be adopted in the field of displays that display images or information using semiconductor light-emitting devices.

Embodiments can be adopted in the field of displays that display images or information using micro- or nano-level semiconductor light-emitting devices.

The invention claimed is:

1. A display device comprising:
a substrate;
a first and second assembly wirings alternately arranged on the substrate and spaced apart from each other;
a planarization layer disposed on the first assembly wiring and the second assembly wiring and having a first opening;
a semiconductor light emitting device disposed inside the first opening, wherein a first electrode thereof overlaps the first assembly wiring and the second assembly wiring; and an assembly wiring connection pattern that is spaced apart from the first opening and electrically connects the first assembly wiring and the second assembly wiring,
wherein the first electrode is electrically connected to one of the first assembly wiring or the second assembly wiring.

2. The display device according to claim 1, wherein the first assembly wiring and the second assembly wiring extend in a column direction, and the assembly wiring connection pattern extends in a row direction, so that the first assembly wiring and the second assembly wiring are electrically connected to each other.

3. The display device according to claim 1, wherein the first assembly wiring is separated from the first electrode within the first opening, and the second assembly wiring is in contact with the first electrode.

4. The display device according to claim 3, wherein the first assembly wiring is electrically connected to the first electrode through the assembly wiring connection pattern and the second assembly wiring.

5. The display device according to claim 1, further comprising an insulating layer covering the first assembly wiring,
wherein the assembly wiring connection pattern is in contact with the first assembly wiring through the planarization layer and a contact hole of the insulating layer, and is in contact with the second assembly wiring through a contact hole of the planarization layer.

6. The display device according to claim 1, further comprising a pixel electrode disposed on the semiconductor light emitting device and the planarization layer,
wherein the pixel electrode is disposed on the same plane as the assembly wiring connection pattern.

7. The display device according to claim 1, wherein the first assembly wiring, the second assembly wiring, and the assembly wiring connection pattern have the same potential.

8. The display device according to claim 1, wherein the second assembly wiring extends beyond a center of the first opening and is disposed on a different plane from the first assembly wiring.

9. The semiconductor light emitting device of claim 1, wherein the first assembly wiring vertically overlaps the second assembly wiring, and the second assembly wiring includes an electrode hole in a region that vertically overlaps the first assembly wiring.

10. The display device according to claim 1, wherein the second assembly wiring includes an electrode hole in a region that vertically overlaps the first assembly wiring.

11. A display device comprising:
a substrate having a plurality of sub-pixels defined;
a first assembly wiring arranged along a plurality of sub-pixels arranged in a same column among the plurality of sub-pixels;
a second assembly wiring arranged along the plurality of sub-pixels arranged in the same column among the plurality of sub-pixels, the second assembly wiring being disposed adjacent to the first assembly wiring;
a planarization layer including a first opening overlapping the first assembly wiring and the second assembly wiring;
a semiconductor light emitting device disposed in the first opening of each of the plurality of sub-pixels and electrically connected to the second assembly wiring; and
an assembly wiring connection pattern disposed on the planarization layer and electrically connected to the first assembly wiring and the second assembly wiring.

12. The display device according to claim 11, wherein the first assembly wiring is electrically connected to the semiconductor light emitting device through the assembly wiring connection pattern and the second assembly wiring, and the first assembly wiring in the first opening is spaced apart from the semiconductor light emitting device.

13. The display device according to claim 11, wherein the assembly wiring connection pattern electrically connects the first assembly wiring and the second assembly wiring disposed in a sub-pixel.

14. The semiconductor device of claim 11, wherein the assembly wiring connection pattern is disposed along a plurality of sub-pixels arranged in a same row among the plurality of sub-pixels to electrically connect the first assembly wiring and the second assembly wiring.

15. The display device according to claim 14, wherein the first assembly wiring, the second assembly wiring, and the assembly wiring connection pattern form a mesh shape.

16. The display device according to claim 11, wherein the second assembly wiring is disposed to extend beyond a center of the first opening.

17. The display device according to claim 16, wherein the second assembly wiring is disposed on a different plane from the first assembly wiring.

18. The display device according to claim 11, wherein the first assembly wiring vertically overlaps the second assembly wiring.

* * * * *